US009442670B2

(12) United States Patent
Kruger

(10) Patent No.: US 9,442,670 B2
(45) Date of Patent: Sep. 13, 2016

(54) METHOD AND SYSTEM FOR REBALANCING DATA STORED IN FLASH MEMORY DEVICES

(71) Applicant: SanDisk Technologies Inc., Plano, TX (US)

(72) Inventor: Warren Fritz Kruger, Sunnyvale, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/470,596

(22) Filed: Aug. 27, 2014

(65) Prior Publication Data

US 2015/0067245 A1    Mar. 5, 2015

Related U.S. Application Data

(60) Provisional application No. 61/873,326, filed on Sep. 3, 2013.

(51) Int. Cl.
     *G06F 12/00*      (2006.01)
     *G06F 3/06*      (2006.01)
     (Continued)

(52) U.S. Cl.
     CPC ........... *G06F 3/0634* (2013.01); *G06F 3/0619* (2013.01); *G06F 3/0653* (2013.01);
     (Continued)

(58) Field of Classification Search
     CPC .................. G06F 12/0246; G06F 2212/7201; G06F 2212/7202; G06F 2212/7204; G06F 2212/7208; G06F 3/0689
     See application file for complete search history.

(56) References Cited

U.S. PATENT DOCUMENTS 4,916,652 A    4/1990   Schwarz et al.
5,270,979 A    12/1993   Harari et al.
(Continued)

FOREIGN PATENT DOCUMENTS

EP    1 465 203 A1    10/2004
EP    1 990 921 A2    11/2008
(Continued)

OTHER PUBLICATIONS

Barr, "Introduction to Watchdog Timers," Oct. 2001, 3 pgs.
(Continued)

*Primary Examiner* — Shawn X Gu
(74) *Attorney, Agent, or Firm* — Morgan, Lewis & Bockius LLP

(57) ABSTRACT

The embodiments described herein include systems, methods and/or devices that may enhance the endurance of a storage system including a storage medium. The method includes: dividing a plurality of flash memory devices into logical chunks each logical chunk including one or more flash memory blocks; assigning a weight to each of the flash memory devices for a distribution algorithm, where the weight is based on at least a number of available logical chunks; and storing data in the logical chunks in accordance with the distribution algorithm. The method includes detecting a trigger condition for a respective flash memory device. In response to detecting the trigger condition, the method includes: decreasing the weight of the respective flash memory device; updating the distribution algorithm to reflect the decreased weight of the respective flash memory device; and rebalancing data stored in the plurality of flash memory devices in accordance with the updated distribution algorithm.

24 Claims, 9 Drawing Sheets

(51) Int. Cl.
*G06F 12/02* (2006.01)
*G11C 16/34* (2006.01)
*G11C 29/00* (2006.01)
*G06F 11/10* (2006.01)

(52) U.S. Cl.
CPC .......... *G06F3/0688* (2013.01); *G06F 3/0689* (2013.01); *G06F 11/1048* (2013.01); *G06F 12/0246* (2013.01); *G11C 16/349* (2013.01); *G11C 29/822* (2013.01); *G06F 2003/0695* (2013.01); *G06F 2212/7201* (2013.01); *G06F 2212/7202* (2013.01); *G06F 2212/7204* (2013.01); *G06F 2212/7208* (2013.01)

(56) References Cited

U.S. PATENT DOCUMENTS

| | | | |
|---|---|---|---|
| 5,519,847 A | 5/1996 | Fandrich et al. | |
| 5,530,705 A | 6/1996 | Malone | |
| 5,537,555 A | 7/1996 | Landry | |
| 5,551,003 A | 8/1996 | Mattson et al. | |
| 5,657,332 A | 8/1997 | Auclair et al. | |
| 5,666,114 A | 9/1997 | Brodie et al. | |
| 5,708,849 A | 1/1998 | Coke et al. | |
| 5,943,692 A | 8/1999 | Marberg et al. | |
| 5,953,255 A | 9/1999 | Lee | |
| 5,982,664 A | 11/1999 | Watanabe | |
| 6,000,006 A | 12/1999 | Bruce et al. | |
| 6,016,560 A | 1/2000 | Wada et al. | |
| 6,018,304 A | 1/2000 | Bessios | |
| 6,070,074 A | 5/2000 | Perahia et al. | |
| 6,138,261 A | 10/2000 | Wilcoxson et al. | |
| 6,182,264 B1 | 1/2001 | Ott | |
| 6,192,092 B1 | 2/2001 | Dizon et al. | |
| 6,295,592 B1 | 9/2001 | Jeddeloh et al. | |
| 6,311,263 B1 | 10/2001 | Barlow et al. | |
| 6,442,076 B1 | 8/2002 | Roohparvar | |
| 6,449,625 B1 | 9/2002 | Wang | |
| 6,484,224 B1 | 11/2002 | Robins et al. | |
| 6,516,437 B1 | 2/2003 | Van Stralen et al. | |
| 6,678,788 B1 | 1/2004 | O'Connell | |
| 6,757,768 B1 | 6/2004 | Potter et al. | |
| 6,775,792 B2 | 8/2004 | Ulrich et al. | |
| 6,810,440 B2 | 10/2004 | Micalizzi, Jr. et al. | |
| 6,836,808 B2 | 12/2004 | Bunce et al. | |
| 6,836,815 B1 | 12/2004 | Purcell et al. | |
| 6,842,436 B2 | 1/2005 | Moeller | |
| 6,871,257 B2 | 3/2005 | Conley et al. | |
| 6,895,464 B2 | 5/2005 | Chow et al. | |
| 6,978,343 B1 | 12/2005 | Ichiriu | |
| 6,980,985 B1 | 12/2005 | Amer-Yahia et al. | |
| 6,981,205 B2 | 12/2005 | Fukushima et al. | |
| 6,988,171 B2 | 1/2006 | Beardsley et al. | |
| 7,020,017 B2 | 3/2006 | Chen et al. | |
| 7,032,123 B2 | 4/2006 | Kane et al. | |
| 7,043,505 B1 | 5/2006 | Teague et al. | |
| 7,100,002 B2 | 8/2006 | Shrader et al. | |
| 7,111,293 B1 | 9/2006 | Hersh et al. | |
| 7,162,678 B2 | 1/2007 | Saliba | |
| 7,173,852 B2 | 2/2007 | Gorobets et al. | |
| 7,184,446 B2 | 2/2007 | Rashid et al. | |
| 7,328,377 B1 | 2/2008 | Lewis et al. | |
| 7,516,292 B2 | 4/2009 | Kimura et al. | |
| 7,523,157 B2 | 4/2009 | Aguilar, Jr. et al. | |
| 7,527,466 B2 | 5/2009 | Simmons | |
| 7,529,466 B2 | 5/2009 | Takahashi | |
| 7,571,277 B2 | 8/2009 | Mizushima | |
| 7,574,554 B2 | 8/2009 | Tanaka et al. | |
| 7,596,643 B2 | 9/2009 | Merry et al. | |
| 7,609,561 B2 | 10/2009 | Cornwell et al. | |
| 7,681,106 B2 | 3/2010 | Jarrar et al. | |
| 7,685,494 B1 | 3/2010 | Varnica et al. | |
| 7,707,481 B2 | 4/2010 | Kirschner et al. | |
| 7,743,203 B2 | 6/2010 | France | |
| 7,761,655 B2 | 7/2010 | Mizushima et al. | |
| 7,761,678 B1 * | 7/2010 | Bodmer ............ G06F 11/3485 711/114 |
| 7,774,390 B2 | 8/2010 | Shin | |
| 7,840,762 B2 | 11/2010 | Oh et al. | |
| 7,870,326 B2 | 1/2011 | Shin et al. | |
| 7,890,818 B2 | 2/2011 | Kong et al. | |
| 7,913,022 B1 | 3/2011 | Baxter | |
| 7,925,960 B2 | 4/2011 | Ho et al. | |
| 7,934,052 B2 | 4/2011 | Prins et al. | |
| 7,954,041 B2 | 5/2011 | Hong et al. | |
| 7,971,112 B2 | 6/2011 | Murata | |
| 7,974,368 B2 | 7/2011 | Shieh et al. | |
| 7,978,516 B2 | 7/2011 | Olbrich | |
| 7,996,642 B1 | 8/2011 | Smith | |
| 8,006,161 B2 | 8/2011 | Lestable et al. | |
| 8,032,724 B1 | 10/2011 | Smith | |
| 8,069,390 B2 | 11/2011 | Lin | |
| 8,190,967 B2 | 5/2012 | Hong et al. | |
| 8,254,181 B2 | 8/2012 | Hwang et al. | |
| 8,312,349 B2 | 11/2012 | Reche et al. | |
| 8,412,985 B1 | 4/2013 | Bowers et al. | |
| 8,711,665 B1 | 4/2014 | Abdul Hamid | |
| 8,898,548 B1 | 11/2014 | Mullendore et al. | |
| 2002/0024846 A1 | 2/2002 | Kawahara et al. | |
| 2002/0083299 A1 | 6/2002 | Van Huben et al. | |
| 2002/0152305 A1 | 10/2002 | Jackson et al. | |
| 2002/0162075 A1 | 10/2002 | Talagala et al. | |
| 2002/0165896 A1 | 11/2002 | Kim | |
| 2003/0041299 A1 | 2/2003 | Kanazawa et al. | |
| 2003/0043829 A1 | 3/2003 | Rashid | |
| 2003/0051090 A1 | 3/2003 | Bonnett et al. | |
| 2003/0088805 A1 | 5/2003 | Majni et al. | |
| 2003/0093628 A1 | 5/2003 | Matter et al. | |
| 2003/0188045 A1 | 10/2003 | Jacobson | |
| 2003/0189856 A1 | 10/2003 | Cho et al. | |
| 2003/0198100 A1 | 10/2003 | Matsushita et al. | |
| 2003/0212719 A1 | 11/2003 | Yasuda et al. | |
| 2004/0024957 A1 | 2/2004 | Lin et al. | |
| 2004/0024963 A1 | 2/2004 | Talagala et al. | |
| 2004/0073829 A1 | 4/2004 | Olarig | |
| 2004/0153902 A1 | 8/2004 | Machado et al. | |
| 2004/0181734 A1 | 9/2004 | Saliba | |
| 2004/0199714 A1 | 10/2004 | Estakhri et al. | |
| 2004/0237018 A1 | 11/2004 | Riley | |
| 2005/0060456 A1 | 3/2005 | Shrader et al. | |
| 2005/0060501 A1 | 3/2005 | Shrader | |
| 2005/0114587 A1 | 5/2005 | Chou et al. | |
| 2005/0172065 A1 | 8/2005 | Keays | |
| 2005/0172068 A1 | 8/2005 | Sukegawa | |
| 2005/0172207 A1 | 8/2005 | Radke et al. | |
| 2005/0193161 A1 | 9/2005 | Lee et al. | |
| 2005/0201148 A1 | 9/2005 | Chen et al. | |
| 2005/0231765 A1 | 10/2005 | So et al. | |
| 2005/0257120 A1 | 11/2005 | Gorobets et al. | |
| 2005/0273560 A1 | 12/2005 | Hulbert et al. | |
| 2005/0289314 A1 | 12/2005 | Adusumilli et al. | |
| 2006/0039196 A1 | 2/2006 | Gorobets et al. | |
| 2006/0053246 A1 | 3/2006 | Lee | |
| 2006/0085671 A1 | 4/2006 | Majni et al. | |
| 2006/0136570 A1 | 6/2006 | Pandya | |
| 2006/0156177 A1 | 7/2006 | Kottapalli et al. | |
| 2006/0158933 A1 | 7/2006 | Ryu | |
| 2006/0195650 A1 | 8/2006 | Su et al. | |
| 2006/0259528 A1 | 11/2006 | Dussud et al. | |
| 2007/0011413 A1 | 1/2007 | Nonaka et al. | |
| 2007/0058446 A1 | 3/2007 | Hwang et al. | |
| 2007/0061597 A1 | 3/2007 | Holtzman et al. | |
| 2007/0076479 A1 | 4/2007 | Kim et al. | |
| 2007/0081408 A1 | 4/2007 | Kwon et al. | |
| 2007/0083697 A1 | 4/2007 | Birrell et al. | |
| 2007/0091677 A1 | 4/2007 | Lasser et al. | |
| 2007/0113019 A1 | 5/2007 | Beukema | |
| 2007/0133312 A1 | 6/2007 | Roohparvar | |
| 2007/0147113 A1 | 6/2007 | Mokhlesi et al. | |
| 2007/0150790 A1 | 6/2007 | Gross et al. | |
| 2007/0157064 A1 | 7/2007 | Falik et al. | |
| 2007/0174579 A1 | 7/2007 | Shin | |
| 2007/0180188 A1 | 8/2007 | Fujibayashi et al. | |
| 2007/0201274 A1 | 8/2007 | Yu et al. | |

(56) References Cited

U.S. PATENT DOCUMENTS

| | | |
|---|---|---|
| 2007/0208901 A1 | 9/2007 | Purcell et al. |
| 2007/0234143 A1 | 10/2007 | Kim |
| 2007/0245061 A1 | 10/2007 | Harriman |
| 2007/0277036 A1 | 11/2007 | Chamberlain et al. |
| 2007/0291556 A1 | 12/2007 | Kamei |
| 2007/0294496 A1 | 12/2007 | Goss et al. |
| 2007/0300130 A1 | 12/2007 | Gorobets |
| 2008/0019182 A1 | 1/2008 | Yanagidaira et al. |
| 2008/0022163 A1 | 1/2008 | Tanaka et al. |
| 2008/0052446 A1 | 2/2008 | Lasser et al. |
| 2008/0056005 A1 | 3/2008 | Aritome |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0112222 A1 | 5/2008 | Shirakawa |
| 2008/0144371 A1 | 6/2008 | Yeh et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0159007 A1 | 7/2008 | Sekar et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0235432 A1 | 9/2008 | Chen et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0320214 A1 | 12/2008 | Ma et al. |
| 2009/0003058 A1 | 1/2009 | Kang |
| 2009/0037652 A1 | 2/2009 | Yu et al. |
| 2009/0046509 A1 | 2/2009 | Annavajjhala et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0207660 A1 | 8/2009 | Hwang et al. |
| 2009/0222708 A1 | 9/2009 | Yamaga |
| 2009/0228761 A1 | 9/2009 | Perlmutter et al. |
| 2009/0240873 A1 | 9/2009 | Yu et al. |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0300269 A1 | 12/2009 | Radke et al. |
| 2009/0319720 A1 | 12/2009 | Stefanus et al. |
| 2009/0319864 A1 | 12/2009 | Shrader |
| 2010/0008140 A1 | 1/2010 | Lee |
| 2010/0023682 A1 | 1/2010 | Lee et al. |
| 2010/0061151 A1 | 3/2010 | Miwa et al. |
| 2010/0103737 A1 | 4/2010 | Park |
| 2010/0161936 A1 | 6/2010 | Royer et al. |
| 2010/0199125 A1 | 8/2010 | Reche |
| 2010/0202196 A1 | 8/2010 | Lee et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0306580 A1 | 12/2010 | McKean et al. |
| 2010/0332895 A1 | 12/2010 | Billing et al. |
| 2010/0332922 A1 | 12/2010 | Chang et al. |
| 2010/0332950 A1 | 12/2010 | Billing et al. |
| 2011/0051513 A1 | 3/2011 | Shen et al. |
| 2011/0083060 A1 | 4/2011 | Sakurada et al. |
| 2011/0113281 A1 | 5/2011 | Zhang et al. |
| 2011/0131444 A1 | 6/2011 | Buch et al. |
| 2011/0173378 A1 | 7/2011 | Filor et al. |
| 2011/0199833 A1 | 8/2011 | Shim et al. |
| 2011/0205823 A1 | 8/2011 | Hemink et al. |
| 2011/0209031 A1 | 8/2011 | Kim et al. |
| 2011/0213920 A1 | 9/2011 | Frost et al. |
| 2011/0219259 A1 | 9/2011 | Frost et al. |
| 2011/0228601 A1 | 9/2011 | Olbrich et al. |
| 2011/0231600 A1 | 9/2011 | Tanaka et al. |
| 2011/0302477 A1 | 12/2011 | Goss et al. |
| 2012/0023285 A1 | 1/2012 | Kim |
| 2012/0096217 A1 | 4/2012 | Son et al. |
| 2012/0110250 A1 | 5/2012 | Sabbag et al. |
| 2012/0144110 A1 | 6/2012 | Smith |
| 2012/0151253 A1 | 6/2012 | Horn |
| 2012/0151294 A1 | 6/2012 | Yoo et al. |
| 2012/0195126 A1 | 8/2012 | Roohparvar |
| 2012/0239976 A1 | 9/2012 | Cometti et al. |
| 2012/0240012 A1 | 9/2012 | Weathers et al. |
| 2012/0284587 A1 | 11/2012 | Yu et al. |
| 2012/0300527 A1 | 11/2012 | Shim et al. |
| 2013/0086454 A1 | 4/2013 | Rub |
| 2013/0138870 A1 | 5/2013 | Yoon et al. |
| 2013/0170297 A1 | 7/2013 | Nam et al. |
| 2013/0176784 A1 | 7/2013 | Cometti et al. |
| 2013/0242667 A1 | 9/2013 | Shim et al. |
| 2014/0006688 A1 | 1/2014 | Yu et al. |
| 2014/0122787 A1 | 5/2014 | Shalvi et al. |
| 2014/0136927 A1 | 5/2014 | Li et al. |
| 2014/0149641 A1 | 5/2014 | Avila et al. |
| 2014/0189421 A1* | 7/2014 | Werner ............... G06F 11/2056 714/6.21 |
| 2014/0281126 A1 | 9/2014 | Bleyer et al. |
| 2014/0281152 A1 | 9/2014 | Karamcheti et al. |
| 2014/0365719 A1 | 12/2014 | Kuzmin et al. |
| 2014/0379968 A1 | 12/2014 | Yao et al. |

FOREIGN PATENT DOCUMENTS

| | | |
|---|---|---|
| JP | 2002-532806 | 10/2002 |
| WO | WO 2007/036834 | 4/2007 |
| WO | WO 2007/080586 | 7/2007 |
| WO | WO 2008/121553 | 10/2008 |
| WO | WO 2008/121577 | 10/2008 |
| WO | WO 2009/028281 | 3/2009 |
| WO | WO 2009/032945 | 3/2009 |
| WO | WO 2009/058140 | 5/2009 |
| WO | WO 2009/084724 | 7/2009 |
| WO | WO 2009/134576 | 11/2009 |
| WO | WO 2011/024015 | 3/2011 |
| WO | WO 2011/031903 | 3/2011 |
| WO | WO 2012/174216 | 12/2012 |

OTHER PUBLICATIONS

Canim, "Buffered Bloom Filters on Solid State Storage," ADMS'10, Singapore, Sep. 13-17, 2010, 8 pgs.
Kang, "A Multi-Channel Architecture for High-Performance NAND Flash-Based Storage System," J. Syst. Archit., vol. 53, Issue 9, Sep. 2007, 15 pgs.
Kim, "A Space-Efficient Flash Translation Layer for CompactFlash Systems," May 2002, IEEE vol. 48, No. 2, 10 pgs.
Lu, "A Forest-structured Bloom Filter with Flash Memory," MSST 2011, Denver, CO, May 23-27, 2011, article, 6 pgs.
Lu, "A Forest-structured Bloom Filter with Flash Memory," MSST 2011, Denver, CO, May 23-27, 2011, presentation slides, 25 pgs.
McLean, "Information Technology-AT Attachment with Packet Interface Extension," Aug. 19, 1998, 339 pgs.
Microchip Technology, "Section 10. Watchdog Timer and Power-Saving Modes," 2005, 14 pages.
Park et al., "A High Performance Controller for NAND Flash-Based Solid State Disk (NSSD)," Proceedings of Non-Volatile Semiconductor Memory Workshop, Feb. 2006, 4 pgs.
Zeidman, 1999 "Verilog Designer's Library", 1999, 9 pgs.
International Search Report and Written Opinion dated Jun. 6, 2013, received in International Patent Application No. PCT/US2012/059447, which corresponds to U.S. Appl. No. 13/602,031, 12 pgs (Tai).

(56) References Cited

OTHER PUBLICATIONS

International Search Report and Written Opinion dated May 23, 2013, received in International Patent Application No. PCT/US2012/065914, which corresponds to U.S. Appl. No. 13/679,963, 7 pgs (Frayer).

International Search Report and Written Opinion, dated Mar. 19, 2009 received in International Patent Application No. PCT/US08/88133, which corresponds to U.S. Appl. No. 12/082,202, 7 pgs (Prins).

International Search Report and Written Opinion dated Feb. 19, 2009, received in International Patent Application No. PCT/US08/88236, which corresponds to U.S. Appl. No. 12/082,203, 7 pgs (Olbrich).

International Search Report and Written Opinion dated Feb. 19, 2009, received in International Patent Application No. PCT/US08/88217, which corresponds to U.S. Appl. No. 12/082,204, 7 pgs (Olbrich).

International Search Report and Written Opinion, dated Mar. 19, 2009, received in International Patent Appiication No. PCT/US08/88136, which corresponds to U.S. Appl. No. 12/082,205, 7 pgs (Olbrich).

International Search Report and Written Opinion dated Feb. 18, 2009, received in International Patent Application No. PCT/US08/88206, which corresponds to U.S. Appl. No. 12/082,206, 7 pgs (Prins).

International Search Report and Written Opinion dated Feb. 27, 2009, received in International Patent Application No. PCT/US2008/088154, which corresponds to U.S. Appl. No. 12/082,207, 8 pgs (Prins).

European Search Report dated Feb. 23, 2012, received in European Patent Application No. 08866997.3, which corresponds to U.S. Appl. No. 12/082,207, 6 pgs (Prins).

Office Action dated Apr. 18, 2012, received in Chinese Patent Application No. 200880127623.8, which corresponds to U.S. Appl. No. 12/082,207, 12 pgs (Prins).

Office Action dated Dec. 31, 2012, received in Chinese Patent Application No. 200880127623.8, which corresponds to U.S. Appl. No. 12/082,207, 9 pgs (Prins).

Notification of the Decision to Grant a Patent Right for Patent for Invention dated Jul. 4, 2013, received in Chinese Patent Application No. 200880127623.8, which corresponds to U.S. Appl. No. 12/082,207, 1 pg (Prins).

Office Action dated Jul. 24, 2012, received in Japanese Patent Application No. JP 2010-540863, 3 pgs (Prins).

International Search Report and Written Opinion dated Feb. 13, 2009, received in International Patent Application No. PCT/US08/88164, which corresponds to U.S. Appl. No. 12/082,220, 6 pgs (Olbrich).

International Search Report and Written Opinion dated Feb. 26, 2009, received in International Patent Application No. PCT/US08/88146, which corresponds to U.S. Appl. No. 12/082,221, 10 pgs (Prins).

International Search Report and Written Opinion dated Feb. 19, 2009, received in International Patent Application No. PCT/US08/88232, which corresponds to U.S. Appl. No. 12/082,222, 8 pgs (Olbrich).

International Search Report and Written Opinion dated Feb. 13, 2009, received in International Patent Application No. PCT/US08/88229, which corresponds to U.S. Appl. No. 12/082,223, 7 pgs (Olbrich).

International Search Report and Written Opinion dated Oct. 27, 2011, received in International Patent Application No. PCT/US2011/028637, which corresponds to U.S. Appl. No. 12/726,200, 13 pgs (Olbrich).

International Search Report and Written Opinion dated Aug. 31, 2012, received in International Patent Application PCT/US2012/042764, which corresponds to U.S. Appl. No. 13/285,873, 12 pgs (Frayer).

International Search Report and Written Opinion dated Mar. 4, 2013, received in PCT/US2012/042771, which corresponds to U.S. Appl. No. 13/286,012. 14 pgs (Stonelake).

International Search Report and Written Opinion dated Sep. 26, 2012, received in International Patent Application No. PCT/US2012/042775, which corresponds to U.S. Appl. No. 13/285,892, 8 pgs (Weston-Lewis et al.).

International Search Report and Written Opinion dated Jun. 6, 2013, received in International Patent Application No. PCT/US2012/059453, which corresponds to U.S. Appl. No. 13/602,039, 12 pgs (Frayer).

International Search Report and Written Opinion dated Feb. 14, 2013, received in International Patent Application No. PCT/US2012/059459, which corresponds to U.S. Appl. No. 13/602,047, 9 pgs (Tai).

International Search Report and Written Opinion dated Jul. 25, 2014, received in International Patent Application No. PCT/US2014/029453, which corresponds to U.S. Appl. No. 13/963,444, 9 pages (Frayer).

International Search Report and Written Opinion dated Mar. 7, 2014, received in International Patent Application No. PCT/US2013/074772, which corresponds to U.S. Appl. No. 13/831,218, 10 pages (George).

International Search Report and Written Opinion dated Mar. 24, 2014, received in International Patent Application No. PCT/US2013/074777, which corresponds to U.S. Appl. No. 13/831,308, 10 pages (George).

International Search Report and Written Opinion dated Mar. 7, 2014, received in International Patent Application No. PCT/US2013/074779, which corresponds to U.S. Appl. No. 13/831,374, 8 pages (George).

International Search Report and Written Opinion dated Apr. 5, 2013, received in International Patent Application No. PCT/US2012/065916, which corresponds to U.S. Appl. No. 13/679,969, 7 pgs (Frayer).

International Search Report and Written Opinion dated Jun. 17, 2013, received in International Patent Application No. PCT/US2012/065919, which corresponds to U.S. Appl. No. 13/679,970, 8 pgs (Frayer).

Kgil et al., "Improving NAND Flash Based Disk Cached", ISCA '08, 35th International Symposium on Computer Architecture, Jun. 21, 2008, 12 pages.

International Search Report and Written Opinion dated Jul. 23, 2015, received in International Patent Application No. PCT/US2015/030847, which corresponds to U.S. Appl. No. 14/321,701, 13 pages (Thuong).

International Search Repost and Written Opinion dated Jul. 23, 2015, received in International Patent Application No. PCT/US2015/030851 which corresponds to U.S. Appl. No. 14/298,841, 15 pages (Higgins).

International Search Report and Written Opinion dated Oct. 27, 2014 received in International Patent Application No. PCT/US2014/053868, which corresponds to U.S. Appl. No. 14/470,580, 8 pages (Kruger).

International Search Report and Written Opinion dated Oct. 29, 2014 received in International Patent Application No. PCT/US2014/053879, which corresponds to U.S. Appl. No. 14/470,596, 8 pages (Kruger).

International Search Report and Written Opinion dated Nov. 6, 2014 received in International Patent Application No. PCT/US2014/053941, 8 pages (Samuels).

International Search Report and Written Opinion dated Nov. 6, 2015, received in International Patent Application No. PCT/US2015/047892 which corresponds to U.S. Appl. No. 14/621,237, 9 pages (Samuels).

International Search Report and Written Opinion dated Nov. 6, 2015, received in International Patent Application No. PCT/US2015/04789 which corresponds to U.S. Appl. No. 14/621,253, 9 pages (Samuels).

International Search Report and Written Opinion dated Oct. 8, 2015, received in International Patent Application No. PCT/US2015/047898 which corresponds to U.S. Appl. No. 14/621,263, 9 pages (Samuels).

(56) References Cited

OTHER PUBLICATIONS

International Search Report and Written Opinion dated Nov. 6, 2015 received in International Patent Application No. PCT/US2015/047901, which corresponds to U.S. Appl. No. 14/621,212, 9 pages (Samuels).

International Search Report and Written Opinion dated Oct. 29, 2015 received in International Patent Application No. PCT/US2014/053941, which corresponds to U.S. Appl. No. 14/621,121, 9 pages (Samuels).

International Search Report and Written Opinion dated Nov. 6, 2015 received in International Patent Application No. PCT/US2014/047908, which corresponds to U.S. Appl. No. 14/621,148, 9 pages (Samuels).

\* cited by examiner

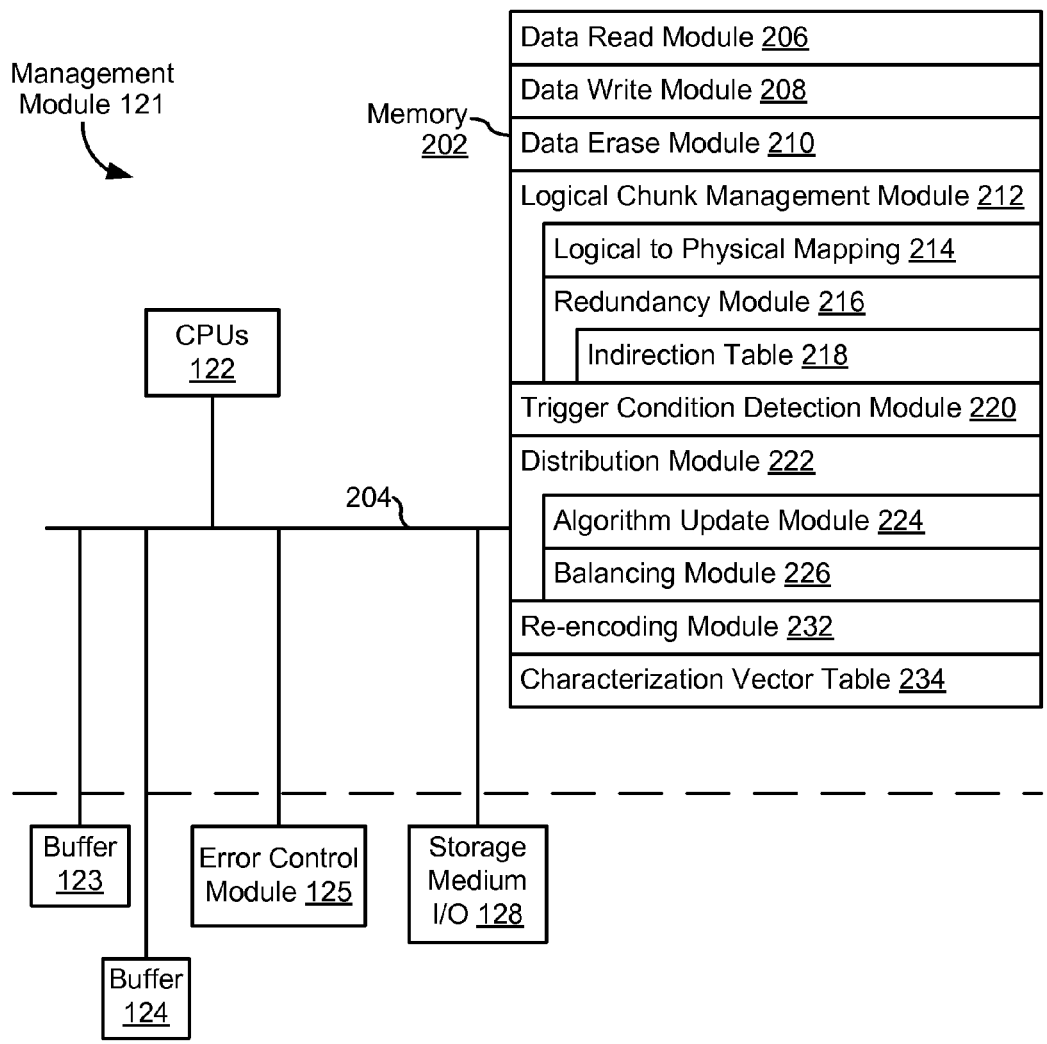
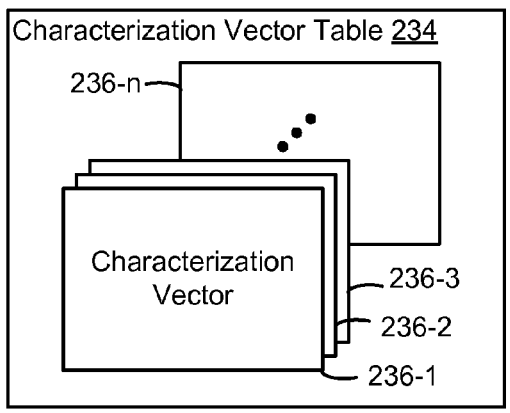
Figure 2B
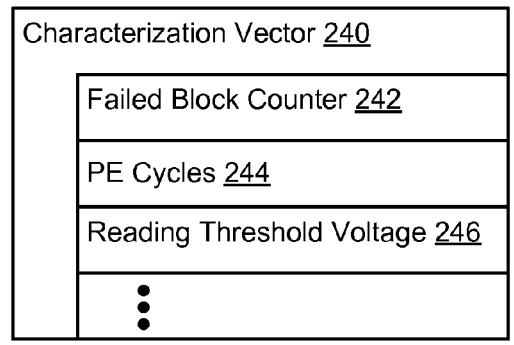
Figure 2C

| | Device 1 | Device 2 | Device 3 | Device 4 | Device 5 | Device 6 | ••• |
|---|---|---|---|---|---|---|---|
| | Logical Chunk 1a | Logical Chunk 2a | Logical Chunk 3a | Logical Chunk 4a | Logical Chunk 5a | Logical Chunk 6a | |
| | Logical Chunk 1b | Logical Chunk 2b | Logical Chunk 3b | Logical Chunk 4b | Logical Chunk 5b | Logical Chunk 6b | |
| | Logical Chunk 1c | Logical Chunk 2c | Logical Chunk 3c | Logical Chunk 4c | Logical Chunk 5c | Logical Chunk 6c | |
| | Logical Chunk 1d | Logical Chunk 2d | Logical Chunk 3d | Logical Chunk 4d | Logical Chunk 5d | Logical Chunk 6d | |
| | Logical Chunk 1e | Logical Chunk 2e | Logical Chunk 3e | Logical Chunk 4e | Logical Chunk 5e | Logical Chunk 6e | |
| | $W_1 = 5$ | $W_2 = 5$ | $W_3 = 5$ | $W_4 = 5$ | $W_5 = 5$ | $W_6 = 5$ | |

Figure 3A

Indirection Table 218

| | Logical Chunk 1 | Logical Chunk 2 | Logical Chunk 3 | Logical Chunk 4 | Logical Chunk 5 | Logical Chunk 6 | ••• |
|---|---|---|---|---|---|---|---|
| Redundancy Set 1 | 1,1 | 2,1 | 3,1 | 4,1 | 5,1 | 6,1 | |
| Redundancy Set 2 | 1,2 | 2,2 | 3,2 | 4,2 | 5,2 | 6,2 | |
| Redundancy Set 3 | 1,3 | 2,3 | 3,3 | 4,3 | 5,3 | 6,3 | |
| Redundancy Set 4 | 1,4 | 2,4 | 3,4 | 4,4 | 5,4 | 6,4 | |
| Redundancy Set 5 | 1,5 | 2,5 | 3,5 | 4,5 | 5,5 | 6,5 | |
| ⋮ | | | | | | | |

Figure 3B

Indirection Table 218

| | Logical Chunk 1 | Logical Chunk 2 | Logical Chunk 3 | Logical Chunk 4 | Logical Chunk 5 | Logical Chunk 6 | ... |
|---|---|---|---|---|---|---|---|
| Redundancy Set 1 | 1,1 | X,X | 3,1 | 4,1 | 5,1 | 6,1 | |
| Redundancy Set 2 | 1,2 | 2,2 | 3,2 | X,X | 5,2 | 6,2 | |
| Redundancy Set 3 | X,X | X,X | 3,3 | 4,3 | 5,3 | 6,3 | |
| Redundancy Set 4 | 1,4 | 2,4 | 3,4 | 4,4 | 5,4 | X,X | |
| Redundancy Set 5 | 1,5 | X,X | 3,5 | X,X | 5,5 | 6,5 | |
| ⋮ | | | | | | | |

METHOD AND SYSTEM FOR REBALANCING DATA STORED IN FLASH MEMORY DEVICES

RELATED APPLICATIONS

This application claims priority to U.S. Provisional Patent Application No. 61/873,326, filed Sep. 3, 2013, which is hereby incorporated by reference in its entirety.

TECHNICAL FIELD

The disclosed embodiments relate generally to memory systems, and in particular, to improving the endurance of a storage system including a storage medium (e.g., comprising one or more flash memory devices).

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Increases in storage density have been facilitated in various ways, including increasing the density of memory cells on a chip enabled by manufacturing developments, and transitioning from single-level flash memory cells to multi-level flash memory cells, so that two or more bits can be stored by each flash memory cell. A drawback of increasing storage density is that the stored data is increasingly prone to being stored and/or read erroneously.

In some cases, when a trigger condition for a flash memory device is detected (e.g., an unrecoverable codeword is read from the flash memory device, the computational resources required to recover a codeword exceed a predefined threshold, or a count of program-erase (PE) cycles for the flash memory device exceeds a threshold value), the entire flash memory device is considered to have failed. In turn, all data stored on the flash memory device must be replicated and stored on a different flash memory device. This whole-device replication discards any remaining life or value associated with still-working portions of the device that is considered to have failed, consumes resources and places undue strain on remaining flash memory devices.

SUMMARY

In some embodiments, a storage controller is configured to divide a plurality of flash memory devices into a plurality of logical chunks and store data in the plurality of logical chunks in accordance with a distribution algorithm. After detecting a predefined trigger condition as to a respective flash memory device of the plurality of flash memory devices, the storage controller is configured to update the distribution algorithm by altering a the distribution algorithm and moving data among the flash memory devices in accordance with the updated distribution algorithm. As such, logical chunks are moved to new locations as trigger conditions are detected as to the flash memory device instead of the entire flash memory device failing and consequently replicated at once.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate the more pertinent features of the present disclosure and are therefore not to be considered limiting, for the description may admit to other effective features.

FIG. 2A is a block diagram illustrating an implementation of a management module in accordance with some embodiments.

FIG. 2B is a diagram illustrating a characterization vector table included in FIG. 2A in accordance with some embodiments.

FIG. 2C is a diagram illustrating a characterization vector included in FIG. 2B in accordance with some embodiments.

FIG. 3A is a block diagram of a plurality of logical chunks in accordance with some embodiments.

FIG. 3B is a diagram of an indirection table corresponding to the plurality of logical chunks in FIG. 3A in accordance with some embodiments.

Figure 1:
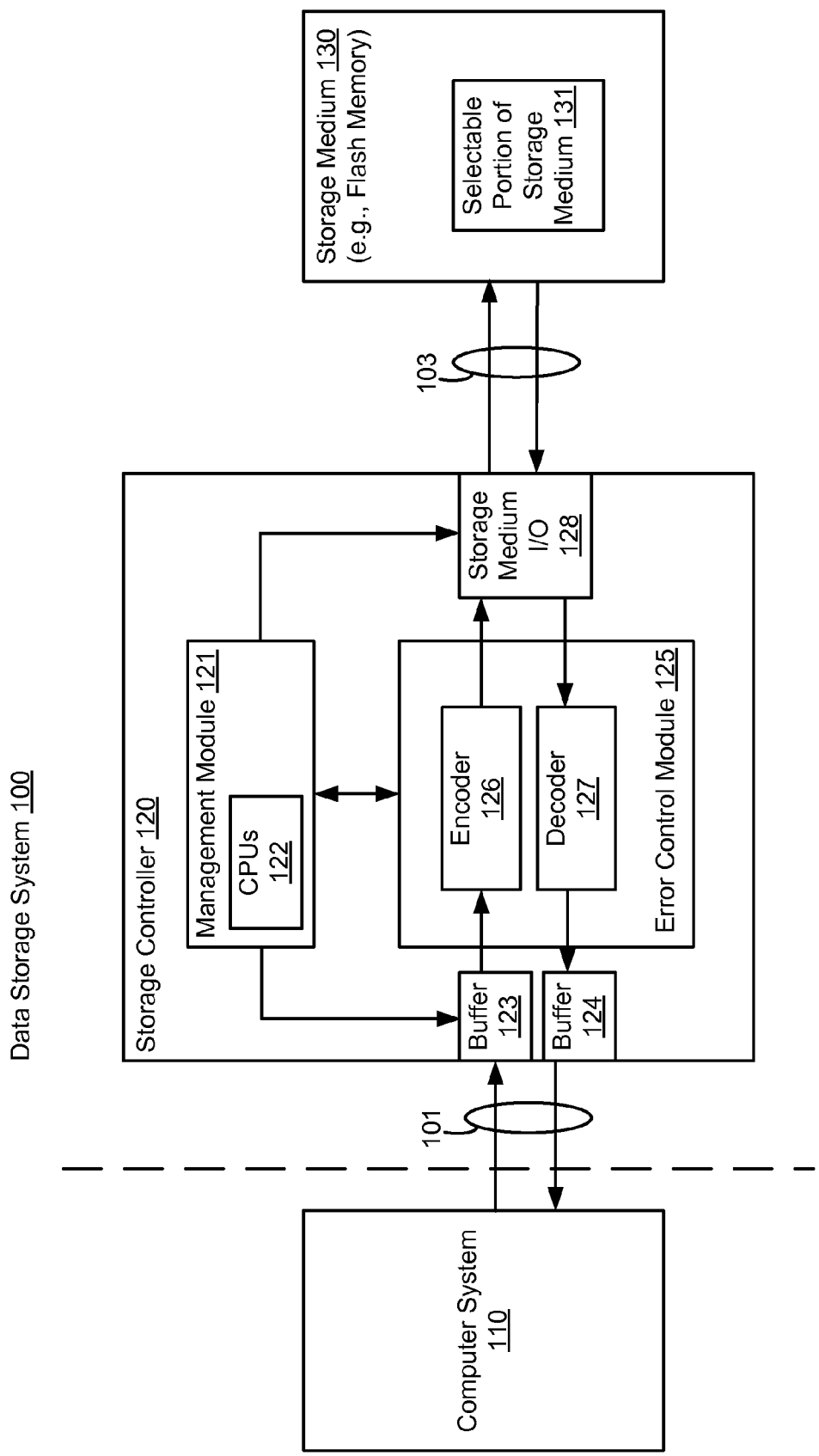
FIG. 1 is a block diagram illustrating an implementation of a data storage system in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various embodiments described herein include devices and/or methods that may improve the endurance of a storage system including a storage medium (e.g., comprising one or more flash memory devices). Some embodiments include methods and/or systems for managing a storage system by rebalancing data stored in flash memory devices of the storage system.

More specifically, some embodiments include a method of managing a storage system that comprises a storage controller and a plurality of flash memory devices each with a plurality of flash memory blocks. In some embodiments, the method is performed at the storage controller. The method includes: dividing each of the plurality of flash memory devices into a plurality of logical chunks, where each logical chunk includes one or more flash memory blocks; and assigning a weight to each of the plurality of flash memory devices for a distribution algorithm, where the weight is based on at least a number of available logical chunks. The method also includes storing data in the plurality of logical chunks of the plurality of flash memory devices in accordance with the distribution algorithm. The method further includes detecting a predefined trigger condition with respect to a respective flash memory device of the plurality of flash memory devices. In response to detecting the predefined trigger condition, the method includes: decreasing the weight corresponding to the respective flash memory device; updating the distribution algorithm to reflect the decreased weight of the respective flash memory device; and rebalancing data stored in the plurality of flash memory devices in accordance with the updated distribution algorithm.

Some embodiments include a storage controller comprising: one or more processors; a host interface configured to couple the storage controller to a host; a storage medium interface configured to couple the storage controller to a storage medium including a plurality of flash memory devices, each with a plurality of flash memory blocks; and a storage controller storing instructions, which when executed by the one or more processors, cause the storage controller to perform the operations of any of the methods described herein.

Some embodiments include a non-transitory computer readable storage medium, storing one or more programs for execution by one or more processors of a storage controller coupled to a storage medium including a plurality of flash memory devices, where each flash memory device includes a plurality of flash memory blocks, the one or more programs including instructions that when executed by the one or more processors cause the storage controller to perform the operations of any of the methods described herein.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the embodiments described herein.

FIG. 1 is a diagram of an implementation of a data storage system 100, in accordance with some embodiments. While some example features are illustrated, various other features have not been illustrated for the sake of brevity and so as not to obscure more pertinent aspects of the example embodiments disclosed herein. To that end, as a non-limiting example, data storage system 100 includes a storage controller 120, and a storage medium 130, and is used in conjunction with a computer system 110. In some embodiments, storage medium 130 is a single flash memory device while in other embodiments storage medium 130 includes a plurality of flash memory devices. In some embodiments, storage medium 130 is NAND-type flash memory or NOR-type flash memory. Further, in some embodiments, storage controller 120 is a solid-state drive (SSD) controller. However, other types of storage media may be included in accordance with aspects of a wide variety of embodiments (e.g., PCRAM, ReRAM, STT-RAM, etc.). In some embodiments, a flash memory device includes one or more flash memory die, one or more flash memory packages, one or more flash memory channels, one or more SSDs, one or more SSD arrays, or the like.

Computer system 110 is coupled to storage controller 120 through data connections 101. However, in some embodiments computer system 110 includes storage controller 120 as a component and/or a sub-system. For example, some or all of the functionality of storage controller 120 is implemented by software executed on computer system 110. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host or host system. In some embodiments, computer system 110 includes one or more processors, one or more types of memory, a display and/or other user interface components such as a keyboard, a touch screen display, a mouse, a track-pad, a digital camera and/or any number of supplemental devices to add functionality.

Storage medium 130 is coupled to storage controller 120 through connections 103. Connections 103 are sometimes called data connections, but typically convey commands in addition to data, and optionally convey metadata, error correction information and/or other information in addition to data values to be stored in storage medium 130 and data values read from storage medium 130. In some embodiments, however, storage controller 120 and storage medium 130 are included in the same device as components thereof. Furthermore, in some implementations memory controller 120 and storage medium 130 are embedded in a host device, such as a mobile device, tablet, other computer or computer controlled device, and the methods described herein are performed by the embedded memory controller. Storage medium 130 may include any number (i.e., one or more) of memory devices including, without limitation, non-volatile semiconductor memory devices, such as flash memory. For example, flash memory devices can be configured for enterprise storage suitable for applications such as cloud computing, for database applications, primary and/or secondary storage, or for caching data stored (or to be stored) in secondary storage, such as hard disk drives. Additionally and/or alternatively, flash memory can also be configured for relatively smaller-scale applications such as personal flash drives or hard-disk replacements for personal, laptop and tablet computers.

Storage medium 130 is divided into a number of addressable and individually selectable blocks, such as selectable portion 131. In some embodiments, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device.

For example, one block comprises any number of pages, for example, 64 pages, 128 pages, 256 pages or another suitable number of pages. Blocks are typically grouped into a plurality of zones. Each block zone can be independently managed to some extent, which increases the degree of parallelism for parallel operations and simplifies management of storage medium 130.

As noted above, while data storage densities of non-volatile semiconductor memory devices are generally increasing, a drawback of increasing storage density is that the stored data is more prone to being stored and/or read erroneously. As described in greater detail below, error control coding can be utilized to limit the number of uncorrectable errors that are introduced by electrical fluctuations, defects in the storage medium, operating conditions, device history, write-read circuitry, etc., or a combination of these and various other factors.

In some embodiments, storage controller 120 includes a management module 121, an input buffer 123, an output buffer 124, an error control module 125 and a storage medium interface (I/O) 128. Storage controller 120 may include various additional features that have not been illustrated for the sake of brevity and so as not to obscure more pertinent features of the example embodiments disclosed herein, and that a different arrangement of features may be possible. Input and output buffers 123, 124 provide an interface to computer system 110 through data connections 101. Similarly, storage medium I/O 128 provides an interface to storage medium 130 though connections 103. In some embodiments, storage medium I/O 128 includes read and write circuitry, including circuitry capable of providing reading signals to storage medium 130 (e.g., reading threshold voltages for NAND-type flash memory).

In some embodiments, management module 121 includes one or more processing units (CPUs, also sometimes called processors) 122 configured to execute instructions in one or more programs (e.g., in management module 121). In some embodiments, one or more CPUs 122 are shared by one or more components within, and in some cases, beyond the function of storage controller 120. Management module 121 is coupled to input buffer 123, output buffer 124 (connection not shown), error control module 125 and storage medium I/O 128 in order to coordinate the operation of these components.

Error control module 125 is coupled to storage medium I/O 128, input buffer 123 and output buffer 124. Error control module 125 is provided to limit the number of uncorrectable errors inadvertently introduced into data. In some embodiments, error control module 125 is executed in software by the one or more CPUs 122 of management module 121, and, in other embodiments, error control module 125 is implemented in whole or in part using special purpose circuitry to perform encoding and decoding functions. In some embodiments, error control module 125 is implemented in whole or in part by software executed on computer system 110. To that end, error control module 125 includes an encoder 126 and a decoder 127. Encoder 126 encodes data by applying an error control code to produce a codeword, which is subsequently stored in storage medium 130.

When the encoded data (e.g., one or more codewords) is read from storage medium 130, decoder 127 applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, input buffer 123 receives data to be stored in storage medium 130 from computer system 110. The data held in input buffer 123 is made available to encoder 126, which encodes the data to produce one or more codewords. The one or more codewords are made available to storage medium I/O 128, which transfers the one or more codewords to storage medium 130 in a manner dependent on the type of storage medium being utilized.

A read operation is initiated when computer system (host) 110 sends one or more host read commands (e.g., via data lines 101) to storage controller 120 requesting data from storage medium 130. Storage controller 120 sends one or more read access commands to storage medium 130, via storage medium I/O 128, to obtain raw read data in accordance with memory locations (addresses) specified by the one or more host read commands. Storage medium I/O 128 provides the raw read data (e.g., comprising one or more codewords) to decoder 127. If the decoding is successful, the decoded data is provided to output buffer 124, where the decoded data is made available to computer system 110. In some embodiments, if the decoding is not successful, storage controller 120 may resort to a number of remedial actions or provide an indication of an irresolvable error condition.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some embodiments, during a read operation, a reading threshold voltage is applied to the control gate of the transistor and the resulting sensed current or voltage is mapped to a data value.

The terms "cell voltage" and "memory cell voltage," in the context of flash memory cells, means the threshold voltage of the memory cell, which is the minimum voltage that needs to be applied to the gate of the memory cell's transistor in order for the transistor to conduct current. Similarly, reading threshold voltages (sometimes also called reading signals and reading voltages) applied to a flash memory cells are gate voltages applied to the gates of the flash memory cells to determine whether the memory cells conduct current at that gate voltage. In some embodiments, when a flash memory cell's transistor conducts current at a given reading threshold voltage, indicating that the cell voltage is less than the reading threshold voltage, the raw data value for that read operation is a "1" and otherwise the raw data value is a "0."

FIG. 2A is a block diagram illustrating an exemplary management module 121 in accordance with some embodiments. Management module 121 typically includes: one or more processing units (CPUs) 122 for executing modules, programs and/or instructions stored in memory 202 and thereby performing processing operations; memory 202; and one or more communication buses 204 for interconnecting these components. One or more communication buses 204, optionally, include circuitry (sometimes called a chipset) that interconnects and controls communications between system components. Management module 121 is coupled to buffer 123, buffer 124, error control module 125, and storage medium I/O 128 by one or more communication buses 204. Memory 202 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 202, optionally, includes one or more storage devices remotely located from the CPU(s) 122. Memory 202, or alternatively the non-volatile memory device(s) within memory 202, comprises a non-transitory computer readable storage medium. In some embodiments, memory 202, or the non-transitory computer readable storage medium of memory 202, stores the following programs, modules, and data structures, or a subset or superset thereof:

- a data read module 206 for reading data from storage medium 130 comprising a plurality of flash memory devices;
- a data write module 208 for writing data to storage medium 130;
- a data erase module 210 for erasing data from storage medium 130;
- a logical chunk management module 212 for dividing each of the plurality of flash memory devices into a plurality of logical chunks, including:
  - a logical to physical mapping 214 which associates a logical address (or a set of logical addresses) for each of the logical chunks with a physical address (or a set of physical addresses);
  - a redundancy module 216 for arranging the plurality of logical chunks into redundancy sets, including an indirection table 218 for maintaining the location (or physical address) of each logical chunk comprising a redundancy set;
- a trigger condition detection module 220 for detecting a trigger condition as to a respective flash memory device of the plurality of flash memory devices;
- a distribution module 222 for storing data in the plurality of logical chunks in accordance with a distribution algorithm, including:
  - an algorithm update module 224 for updating the distribution algorithm; and
  - a balancing module 226 for balancing (or re-balancing) the stored data among the plurality of flash memory devices;
- a re-encoding module 232 for re-encoding data in a logical chunk with a higher level of error correction protection; and
- a characterization vector table 234 that includes a collection of characterization vectors 236 each storing characterization data for a respective portion of storage medium 130 (e.g., a flash memory device, die, block zone, block, word line, word line zone or page portion of storage medium 130).

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 202 may store a subset of the modules and data structures identified above. Furthermore, memory 202 may store additional modules and data structures not described above. In some embodiments, the programs, modules, and data structures stored in memory 202, or the non-transitory computer readable storage medium of memory 202, provide instructions for implementing any of the methods described below with reference to FIGS. 8A-8C. In some embodiments, some or all of these modules may be implemented with specialized hardware circuits that subsume part or all of the module functionality.

Although FIG. 2A shows a management module 121, FIG. 2A is intended more as functional description of the various features which may be present in a management module than as a structural schematic of the embodiments described herein. In practice, and as recognized by those of ordinary skill in the art, the programs, modules, and data structures shown separately could be combined and some programs, modules, and data structures could be separated.

FIG. 2B is a block diagram illustrating an implementation of a characterization vector table 234 in accordance with some embodiments. Characterization vector table 234 includes a collection of characterization vectors 236, that each store characterization data associated with a respective portion of a storage medium 130 (e.g., a distinct device, die, block zone, block, word line, word line zone or page portion of storage medium 130). In some embodiments, each vector (e.g., vector 236-1, vector 236-2, . . . , vector 236-*n*) in the collection of characterization vectors 236 stores characterization data derived during each of at least two time periods (e.g., time T–1 and time T–2, or X program-erase (PE) cycles and 2× PE cycles). In some embodiments, the characterization data stored in the characterization vectors 236 is statistically derived. For example, without limitation, in some embodiments in which a storage medium (e.g., storage medium 130, FIG. 1) includes a plurality of flash memory devices characterization vector table 234 includes at least one characterization vector for each distinct flash memory device. In another example, in some embodiments, characterization vector table 234 includes a set of distinct characterization vectors 236 for each flash memory device in a storage medium 130, and the set of distinct characterization vectors 236 for each flash memory device includes at least one distinct characterization vector for each flash memory die in the flash memory device. More detailed example embodiments of characterization vectors 236 are described below with reference to FIG. 2C.

FIG. 2C is a schematic diagram of an implementation of a characterization vector 240 (e.g., corresponding to one of characterization vectors 236 shown in FIG. 2B) for a respective flash memory device of the plurality of flash memory devices in accordance with some embodiments. In some embodiments, characterization data stored in characterization vector 240 includes storage medium characterization parameter values such as a failed block counter field 242 indicating a number of failed flash memory blocks for the respective flash memory device, a program-erase (PE) cycles field 244 indicating a current count of the number of PE cycles performed on the respective flash memory device, and a reading threshold voltage field 246 with one or more reading threshold voltages for the respective flash memory device. In some embodiments, the one or more storage medium characterization parameter values provide an indication of at least one of: a physical characteristic associated with the respective portion the storage medium (e.g., a distinct device, die, block zone, block, word line, word line zone or page portion of storage medium 130), a mode of operation associated with the respective portion of the storage medium, a history of use associated with the respective portion of the storage medium, a condition characteristic associated with the respective portion of the storage medium, a read type associated with the respective portion of the storage medium, and location(s) associated with the respective portion of the storage medium.

FIG. 3A is a block diagram of a plurality of logical chunks in accordance with some embodiments. FIG. 3A shows a plurality of flash memory devices included in storage medium 130 (e.g., devices 1, 2, 3, 4, 5, 6, . . . ) that are not all necessarily the same size. In some embodiments, storage medium 130 comprises a greater or lesser number of flash memory devices. In some embodiments, each of the plurality of flash memory devices is a single die or a multi-die flash memory device. In some embodiments, storage controller 120 and storage medium 130 comprise a storage system, where storage medium 130 comprises one or more memory devices such as flash memory devices.

In FIG. 3A, for example, storage controller 120 or a component thereof (e.g., logical chunk management module 212, FIG. 2A) divides each of the flash memory devices into a plurality of logical chunks that are not all necessarily the same size. For example, device 1 is divided into logical chunks 1a, 1b, 1c, 1d, 1e. Each logical chunk is assigned to a logical address (or set of logical addresses) which is mapped to a physical address (or set of physical addresses) in logical to physical mapping 214. In some embodiments, the size of the logical chunks is determined in software by a system administrator of the storage system. In some embodiments, the size of the logical chunks is determined by a protocol used by the storage system.

In some embodiments, storage controller 120 or a component thereof (e.g., distribution module 222, FIG. 2A) is configured to store data in the plurality of logical chunks according to a distribution algorithm. In some embodiments, the distribution algorithm utilizes a flexible hash function to pseudo-randomly identify a logical chunk in which to store data based on a map hierarchy and a set of distribution rules. For example, the distribution algorithm could be derived from the controlled replication under scalable hashing (CRUSH) algorithm described in Weil, Sage A. (2007), *CEPH: Reliable, Scalable, and High-Performance Distributed Storage* (Doctoral dissertation). In some embodiments, the map hierarchy reflects the storage resources of the storage system (e.g., storage medium 130). For example, when storage medium 130 comprises an enterprise storage environment, the map hierarchy includes the number of rows in the enterprise storage environment, the number of cabinets per row, the number of shelves per cabinet, the number of flash memory devices per shelf, and the weight of each flash memory device. In some embodiments, each of the levels of the hierarchy (i.e., row, cabinet, shelf, flash memory device) is considered a failure domain. In some embodiments, storage controller 120 or a component thereof (e.g., algorithm update module 224, FIG. 2A) is configured to modify the map hierarchy as storage resources (e.g., a flash memory device, an entire rack, etc.) are added or removed from the enterprise storage environment.

In some embodiments, the set of distribution rules includes a number of redundant copies of data that must be stored, a number of failure domains between redundant copies of data, and the number of failure domains that must be crossed when migrating a logical chunk from a respective flash memory device to a second flash memory device upon detecting a predefined trigger condition as to the respective flash memory device. For example, if the set of distribution rules indicate that a migrated logical chunk must cross at least two failure domains and the respective logical chunk is stored in row 1, cabinet 2, shelf 3, device 4, the respective logical chunk must at least be migrated to (e.g., replicated and the replicated copy stored in) a different shelf in cabinet 2 (e.g., crossing the device and shelf failure domains). In some embodiments, the set of distribution rules are chosen so that migrated logical chunks are stored on different electrical circuits, controlled by different memory controllers, or located in different physical locations than the respective logical chunk. For example, the set of distribution rules indicate that three redundant copies of data must be stored in flash memory devices in different cabinets that do not share a same electrical circuit.

FIG. 3A also shows a weight for each of the plurality of flash memory devices. In FIG. 3A, for example, each of the plurality of flash memory devices has a weight equal to five. The weight of a respective flash memory device is based on at least the number of logical chunks that are allocated to a flash memory device or the number of logical chunks on the flash memory device that are available for storing data. For example, a logical chunk is considered allocated when it has been assigned a logical address (or a set of logical addresses).

FIG. 3B is a diagram of an indirection table corresponding to the plurality of logical chunks in FIG. 3A in accordance with some embodiments. In some embodiments, after (or while) dividing the plurality of flash memory devices into a plurality of logical chunks, storage controller 120 or a component thereof (e.g., redundancy module 216, FIG. 2A) is configured to arrange the plurality of logical chunks into redundancy sets, where each redundancy set includes one or more logical chunks. In some embodiments, each redundancy set stores redundant data sufficient to enable recovery of data stored in at least one of the one or more logical chunks. Indirection table 218 includes the location (or physical address) of the one or more logical chunks in each redundancy set. In some embodiments, storage controller 120 or a component thereof (e.g., redundancy module 216, FIG. 2A) is configured to maintain and update indirection table 218 as the physical addresses of the one or more logical chunks in redundancy sets change over time (e.g., as a logical chunk is migrated between flash memory devices).

In FIG. 3B, for example, indirection table 218 illustrates that the physical address for logical chunk 1 in redundancy set 1 is located in the first location (or first range of physical addresses) at flash memory device 1 (e.g., indicated by coordinates 1,1), the physical address for logical chunk 2 in redundancy set 1 is located in the first location (or first range of physical addresses) at flash memory device 2 (e.g., indicated by coordinates 2,1), the physical address for logical chunk 3 in redundancy set 1 is located in the first location (or first range of physical addresses) at flash memory device 3 (e.g., indicated by coordinates 3,1), the physical address for logical chunk 4 in redundancy set 1 is located in the first location (or first range of physical addresses) at flash memory device 4 (e.g., indicated by coordinates 4,1), the physical address for logical chunk 5 in redundancy set 1 is located in the first location (or first range of physical addresses) at flash memory device 5 (e.g., indicated by coordinates 5,1), and the physical address for logical chunk 6 in redundancy set 1 is located in the first location (or first range of physical addresses) at flash memory device 6 (e.g., indicated by coordinates 6,1). In FIG. 3B, for example, redundancy set 1 including logical chunks 1a, 2a, 3a, 4a, 5a, 6a is redundantly encoded across the six flash memory devices (e.g., a contiguous RAID stripe). In FIG. 3B, for example, redundancy sets 2-5 follow a similar organizational scheme as redundancy set 1. One of ordinary skill in the art will appreciate that a variety of redundancy schemes could be implemented but are not discussed here for sake of brevity.

Figures 4A, 4B:
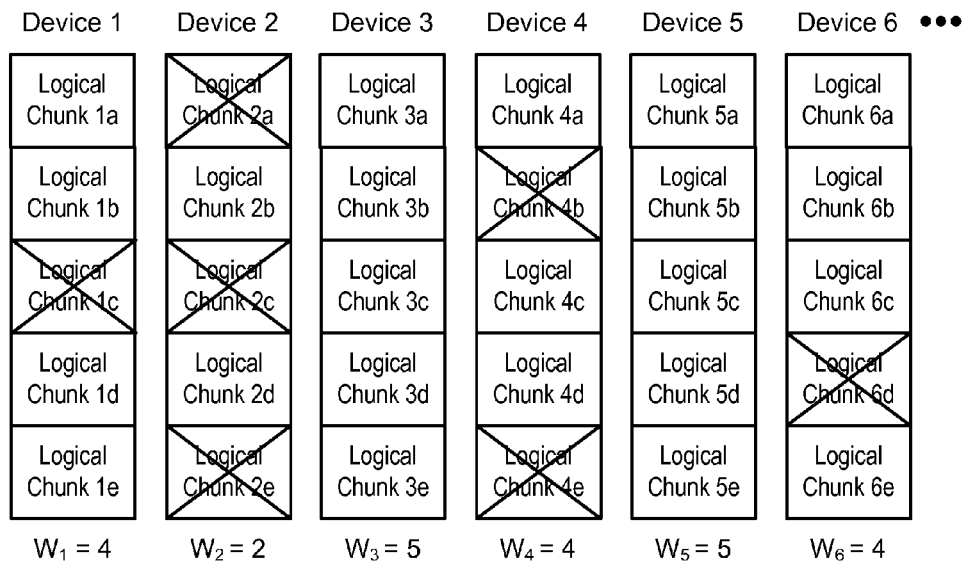
FIG. 4A is a block diagram of a plurality of logical chunks in accordance with some embodiments.
FIG. 4B is a diagram of an indirection table corresponding to the plurality of logical chunks in FIG. 4A in accordance with some embodiments.

FIG. 4A is a block diagram of a plurality of logical chunks in accordance with some embodiments. For example, after detecting a predefined trigger condition with respect to a respective flash memory device of the plurality of flash memory devices, storage controller 120 or a component thereof (e.g., distribution module 224, FIG. 2A) is configured to decrease the weight associated with the respective flash memory device. The detection of a predefined trigger condition is discussed in more detail below with respect to FIGS. 5-7. In FIG. 4A, for example, the weight corresponding to flash memory device 1 (e.g., $W_1$) has been decreased from five to four due to the detection of a predefined trigger condition for flash memory device 1. In some embodiments, storage controller 120 or a component thereof (e.g., distribution module 224, FIG. 2A) is also configured to update the distribution algorithm to reflect the decreased weight for flash memory device 1.

In some embodiments, after updating the distribution algorithm, the data stored in the plurality of the flash memory devices is rebalanced in accordance with the updated distribution algorithm. In some embodiments, rebalancing the data stored in the plurality of the flash memory devices comprises migrating at least one logical chunk from the respective flash memory device (for which the predefined trigger condition was detected) to a different flash memory device. In FIG. 4A, for example, logical chunk 1c has been crossed out because it has been migrated off of flash memory device 1 to a different flash memory device in accordance with the distribution algorithm. It should be noted that in some embodiments the predefined condition triggering the migration does not have to originate within the respective logical chunk that is selected for migration, just within the same flash memory device.

FIG. 4B is a diagram of an indirection table corresponding to the plurality of logical chunks in FIG. 4A in accordance with some embodiments. Indirection table 218 is an updated version of the indirection table illustrated in FIG. 3B. In FIG. 4B, indirection table 218 reflects the updated weights of the plurality of flash memory devices shown in FIG. 4A. FIG. 4B, for example, shows that logical chunks 1 and 2 in redundancy set 3 have new physical addresses (e.g., indicated by coordinates X,X) because logical chunks 1c and 2c have been have been migrated off of flash memory devices 1 and 2 and have been stored at different flash memory devices in accordance with the updated distribution algorithm.

Figure 5:
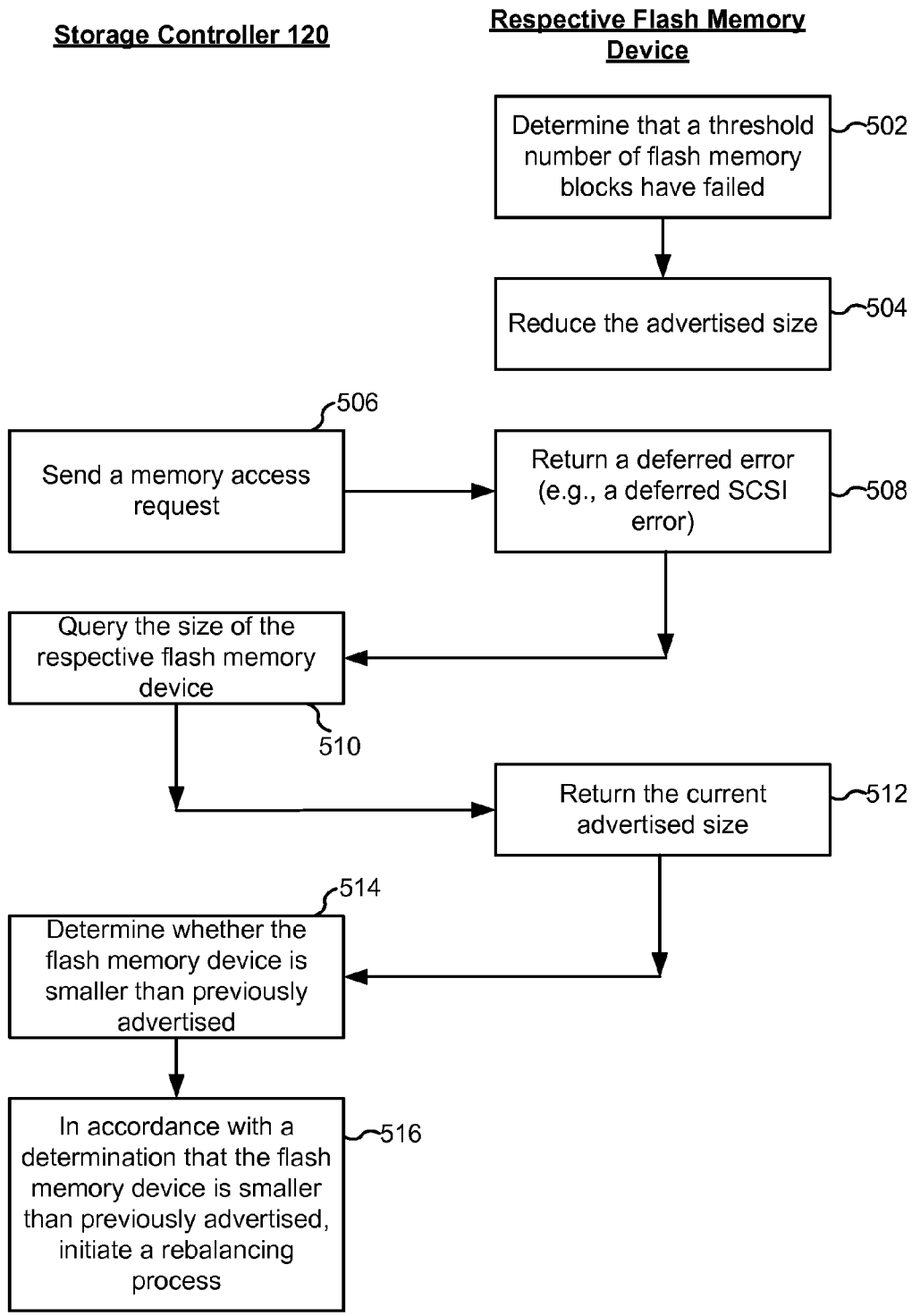
FIGS. 5-7 illustrate flowchart representations of methods of triggering a rebalancing process in accordance with some embodiments.

FIG. 5 illustrates a flowchart representation of a method 500 of triggering a rebalancing process in accordance with some embodiments. In some embodiments, method 500 is performed at a storage system including storage controller 120 and a plurality of flash memory devices (e.g., storage medium 130, FIG. 1) including a respective flash memory device.

At step 502, the respective flash memory device determines that a threshold number of flash memory blocks of the respective flash memory device have failed or will fail sometime in the near future. In some embodiments, each of the plurality of flash memory devices maintains a counter indicating a number of failed flash memory blocks for the respective flash memory device. In some embodiments, storage controller 120 or a component thereof is configured to maintain a counter for each of the plurality of flash memory devices indicating a number of failed flash memory blocks for a respective flash memory device of the plurality of flash memory devices. In some embodiments, storage controller 120 or a component thereof is configured to store and maintain a collection of characterization vectors 236 for each of the plurality of flash memory devices in a characterization vector table 234. In some embodiments, a respective characterization vector 236 for a respective flash memory device includes a failed block counter field 242 indicating a number of failed flash memory blocks for the respective flash memory device. In some embodiments, a flash memory block fails when one or more codewords read from the flash memory block are uncorrectable or other error correction code (ECC) information produced after one or more codewords are read from the flash memory block indicates that a bit error rate corresponding to the one or more codewords exceeds a predefined threshold. In some embodiments, a flash memory block fails when a count of PE cycles for the flash memory block exceeds a predefined threshold. In some embodiments, the threshold number of failed flash memory blocks is equal to the number of flash memory blocks in a logical chunk. In some embodiments, the threshold number of failed flash memory blocks is equal to an integer multiple of the number of flash memory blocks in a logical chunk.

At step 504, the respective flash memory device reduces its advertised size. In some embodiments, the difference between the current (or reduced) advertised size and the previous advertised size is equal to the number of flash memory blocks comprising a logical chunk. In some embodiments, the advertised size of a flash memory device is an amount of bytes or addresses advertised to storage controller 120 that is equal to the amount of logical chunks that are storing data and are available for storing data. In some embodiments, the advertised size of a flash memory device is equal to the difference between the total amount of flash memory blocks comprising the flash memory device and the number of failed flash memory blocks.

At step 506, storage controller 120 directs a memory access request (e.g., a read or write operation) to the respective flash memory device. In some embodiments, storage controller 120 directs the memory access request to the respective flash memory device in response to a request from the host to perform a memory access operation at a logical address corresponding to a memory location associated with the respective flash memory device.

At step 508, the respective flash memory device returns a deferred error to storage controller 120 in response to receiving the memory access request. The deferred error indicates that a threshold number of flash memory blocks of the respective flash memory device have failed. For example, when the small computer system interface (SCSI) protocol is used by the storage system, the deferred error could be a deferred SCSI error which is only returned (or reported) to storage controller 120 upon reception of the memory access request.

At step 510, in response to receiving the deferred error, storage controller 120 queries the respective flash memory device so as to determine its current advertised size. In some embodiments, storage controller 120 or a component thereof (e.g., trigger condition detection module 220, FIG. 2A) is configured to detect a predefined trigger condition as to the respective flash memory device in response to receiving the deferred error. Alternatively, in response to receiving the deferred error, storage controller 120 initiates a rebalancing process (discussed in more detail below with respect to method 800) as to the respective flash memory device.

At step 512, the respective flash memory device returns the current (i.e., reduced) advertised size in response to receiving the query from storage controller 120.

At step 514, storage controller 120 determines whether the current advertised size returned by the respective flash memory device is smaller than a previous advertised size of the respective flash memory device. In some embodiments, storage controller 120 determines whether the current advertised size returned by the respective flash memory device is smaller than the amount of data stored by the respective flash memory device. For example, this indicates that at least an amount of data equal to the difference between the current advertised size and the amount of data stored by the respective flash memory device needs to be migrated to a second flash memory device different from the respective flash memory device.

At step 516, in accordance with a determination that the current advertised size of the respective flash memory device is smaller than a previous advertised size of the respective flash memory device, storage controller 120 initiates a rebalancing process (discussed in more detail below with respect to method 800) as to the respective flash memory device.

Figure 6:
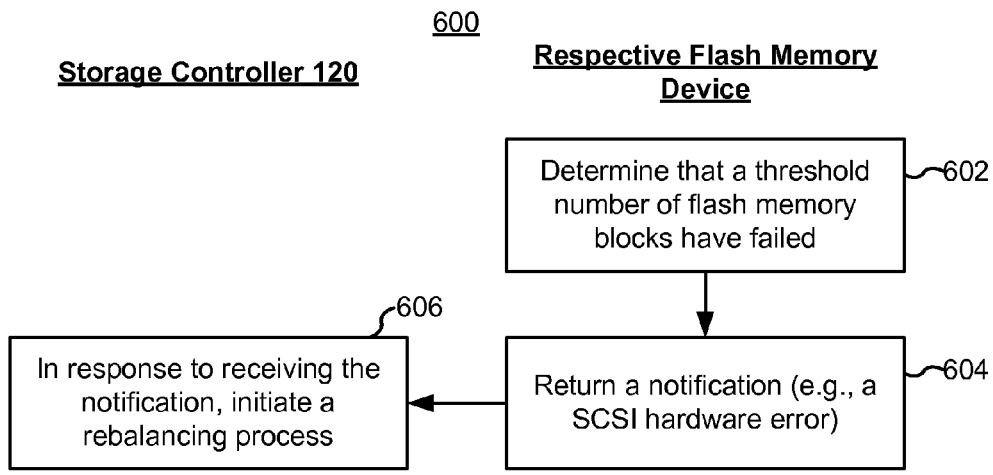

FIG. 6 illustrates a flowchart representation of a method 600 of triggering a rebalancing process in accordance with some embodiments. In some embodiments, method 600 is performed at a storage system including storage controller 120 and a plurality of flash memory devices (e.g., storage medium 130, FIG. 1) including a respective flash memory device.

At step 602, the respective flash memory device determines that a threshold number of flash memory blocks of the respective flash memory device have failed or may fail sometime in the near future. See the discussion above with respect to step 502 of FIG. 5 for examples of criteria for determining whether a respective flash memory device has failed.

At step 604, the respective flash memory device returns a notification to storage controller 120 in response to the determination in step 602. The notification indicates that a threshold number of flash memory blocks of the respective flash memory device have failed. For example, when the small computer system interface (SCSI) protocol is used by the storage system, the, error could be a proactive SCSI hardware error.

At step 606, in response to receiving the notification from the respective flash memory device, storage controller 120 initiates a rebalancing process (discussed in more detail below with respect to method 800) as to the respective flash memory device. In some embodiments, storage controller 120 or a component thereof (e.g., trigger condition detection module 220, FIG. 2A) is configured to detect a predefined trigger condition as to the respective flash memory device in response to receiving the error.

Figure 7:
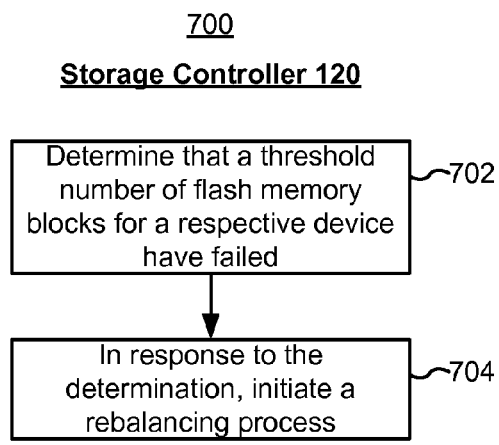

FIG. 7 illustrates a flowchart representation of a method 700 of triggering a rebalancing process in accordance with some embodiments. In some embodiments, method 700 is performed at storage controller 120.

At step 702, storage controller 120 determines that a threshold number of flash memory blocks have failed or may fail sometime in the near future for a respective flash memory device of a plurality of flash memory devices. See the discussion above with respect to step 502 of FIG. 5 for examples of criteria for determining whether a respective flash memory device has failed.

At step 704, in response to determining that a threshold number of flash memory blocks for the respective flash memory device have failed, storage controller 120 initiates a rebalancing process (discussed in more detail below with respect to method 800) as to the respective flash memory device. In some embodiments, storage controller 120 or a component thereof (e.g., trigger condition detection module 220, FIG. 2A) is configured to detect a predefined trigger condition as to the respective flash memory device in response to determining that a threshold number of flash memory blocks for the respective flash memory device have failed.

Figure 8A:
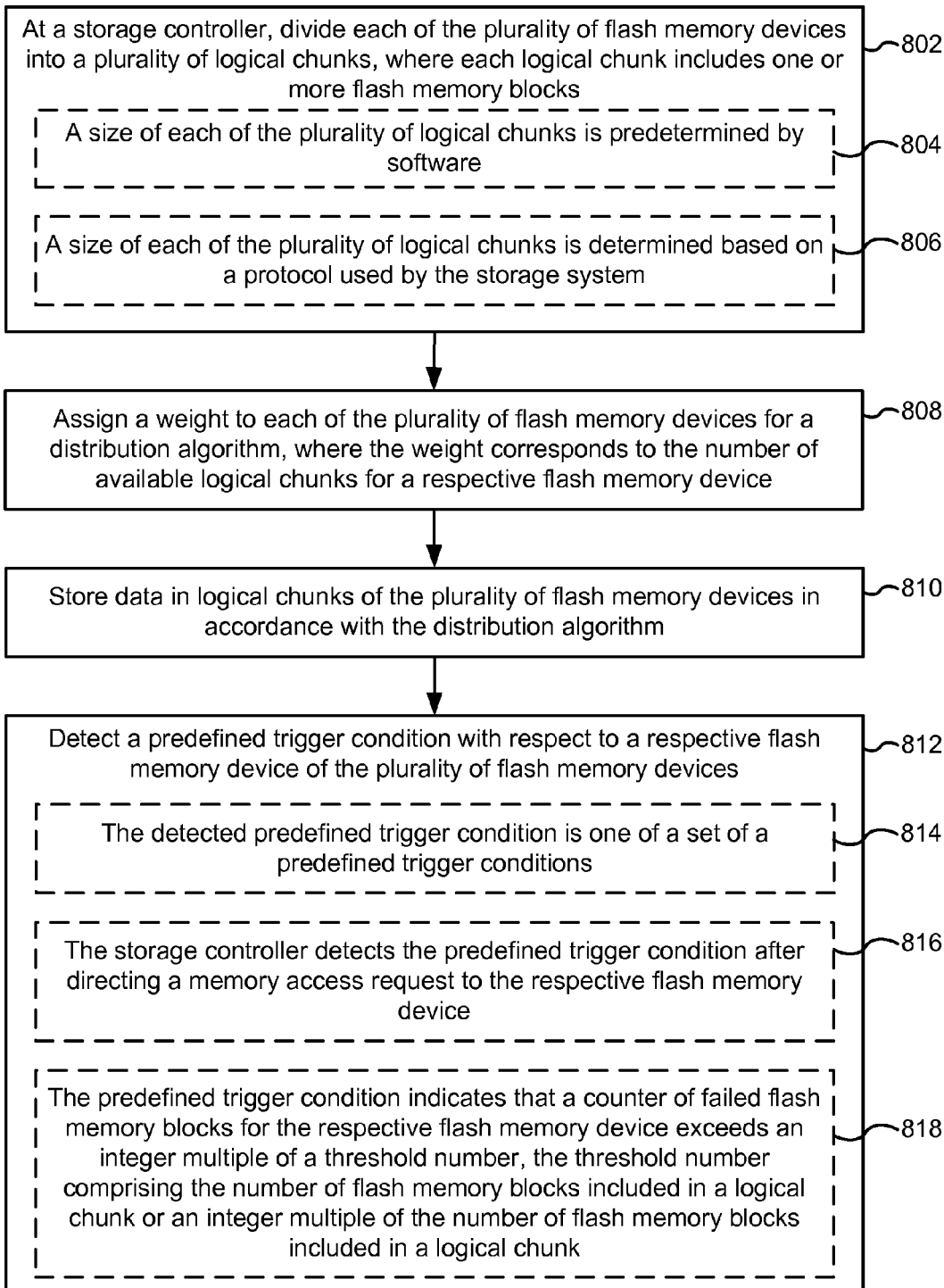
FIGS. 8A-8C illustrate a flowchart representation of a method of managing a storage system in accordance with some embodiments.
Figure 8B:
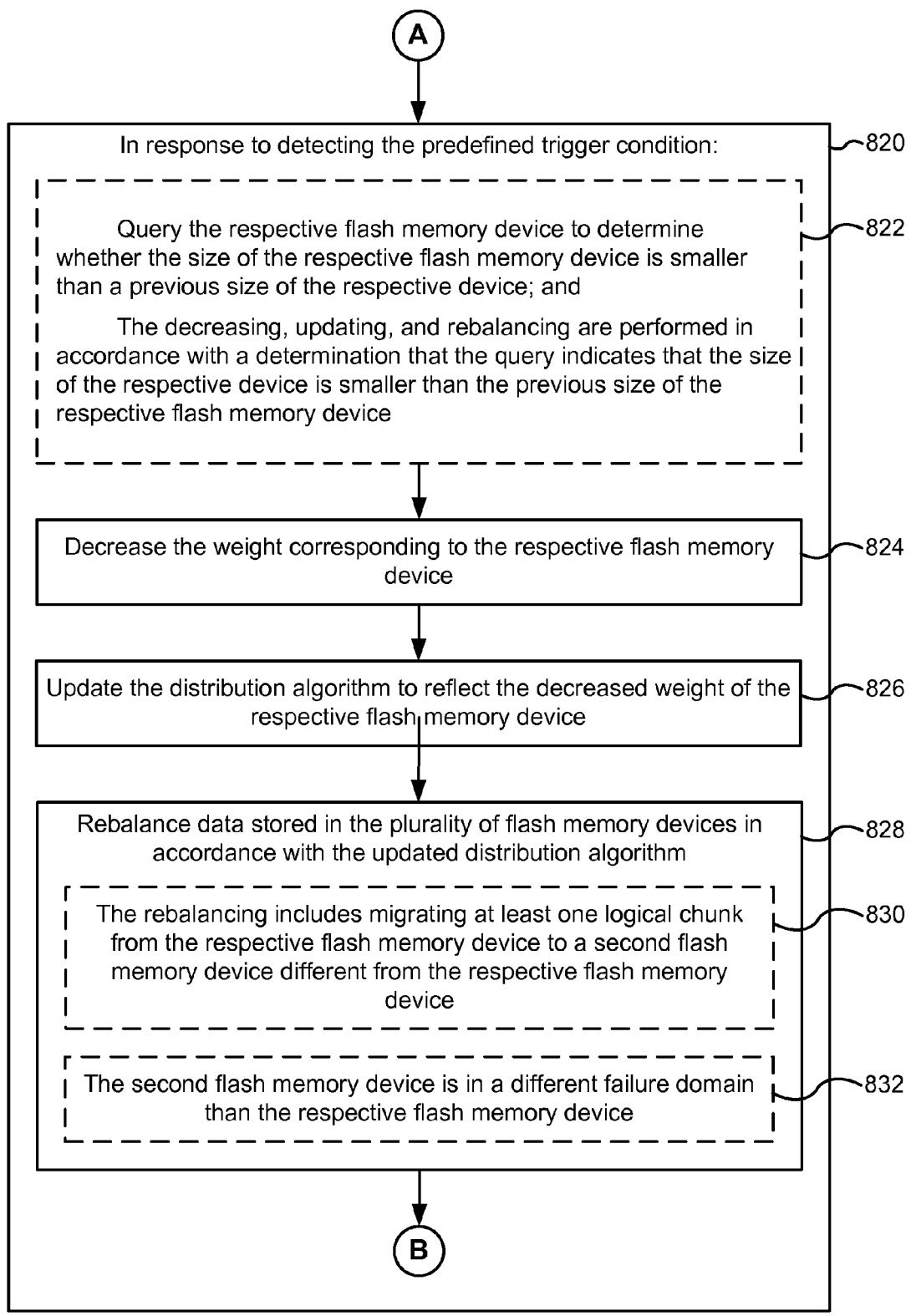
Figure 8C:
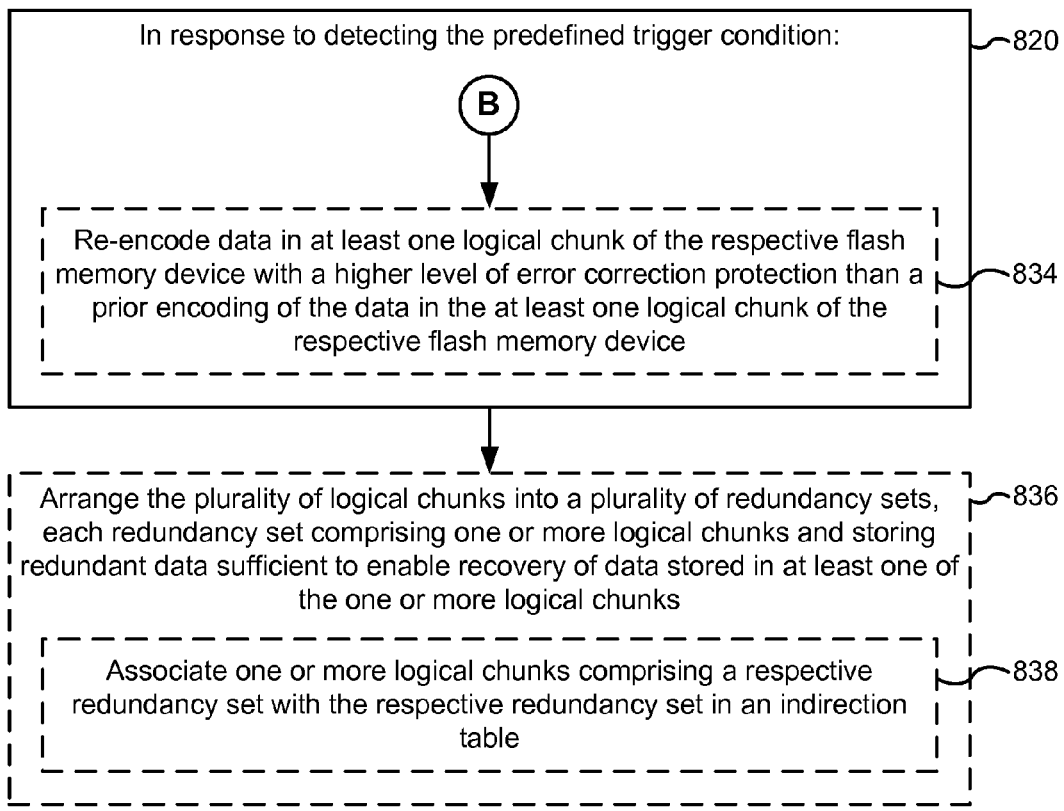

FIGS. 8A-8C illustrate a flowchart representation of a method 800 of managing a storage system that comprises a storage controller and a plurality of flash memory devices each with a plurality of flash memory blocks. In some embodiments, method 800 is performed by storage controller 120 in FIG. 1, which is distinct from and coupled to storage medium 130 in FIG. 1 (e.g., comprising the plurality of flash memory devices) by one or more connections (e.g., connections 103, FIG. 1). Optional operations are indicated by dashed lines (e.g., boxes with dashed-line border).

In some embodiments, method 800 is performed by storage controller 120 or one or more components of storage controller 120 (e.g., management module 121, FIGS. 1 and 2A). In some embodiments, method 800 is governed by instructions that are stored in a non-transitory computer readable storage medium and the instructions are executed by one or more processors of a device, such as one or more processing units (CPUs) 122 of management module 121. In some embodiments, method 800 is performed in whole or in part by computer system 110.

The storage controller divides (802) each of the plurality of flash memory devices into a plurality of logical chunks, where each logical chunk includes one or more flash memory blocks. In some embodiments, storage controller 120 or a component thereof (e.g., logical chunk management module 218, FIG. 2A) is configured to divide each of the plurality of flash memory devices into a plurality of logical chunks. Additionally, the logical address (or set of logical addresses) for each of the plurality of logical chunks are associated with a physical address (or set of physical addresses) in a logical to physical mapping 214. In some embodiments, storage controller 120 or a component thereof (e.g., logical chunk management module 218, FIG. 2A) is configured to maintain and update logical to physical mapping 214 as logical chunks are migrated between flash memory devices.

In some embodiments, a size of the plurality of logical chunks is predetermined (804) by software. For example, an administrator of the storage system is enabled to determine the size of a logical chunk. Typically, the size of a logical chunk is greater than or equal to 1 MB.

In some embodiments, a size of the plurality of logical chunks is determined (806) based on a protocol used by the storage system. For example, when the small computer system interface (SCSI) protocol is used for the storage system, a logical chunk could be a logical unit number (LUN). The SCSI protocol supports up to 64,000 LUNs in the storage system; however, some operating systems only support up to 16,000 LUNs. For example, an 8 TB storage system could be divided into 16,000 500 MB LUNs.

The storage controller assigns (808) a weight to each of the plurality of flash memory devices for a distribution algorithm, where the weight corresponds to (e.g., is based on at least) a number of available logical chunks. In some embodiments, a logical chunk is available when it was been allocated a logical address (or set of logical addresses) and/or is able to store data.

The storage controller stores (810) data in the plurality of logical chunks of the plurality of flash memory devices in accordance with the distribution algorithm. In some embodiments, the distribution algorithm uses a flexible hash function to pseudo-randomly identify a logical chunk in which to store data based on a map hierarchy and a set of distribution rules. In some embodiments, the map hierarchy reflects the available storage resources of the storage system (e.g., storage medium 130, FIG. 1) and the weights of the plurality of flash memory devices in the storage system. In some embodiments, the set of distribution rules includes a number of redundant copies of data that must be stored, a number of failure domains between the redundant copies of data, and the number of failure domains that must be crossed when migrating a logical chunk between flash memory devices.

The storage controller detects (812) a predefined trigger condition with respect to a respective flash memory device of the plurality of flash memory devices. In FIG. 5, for example, storage controller 120 or a component thereof (e.g., trigger condition detection module 220, FIG. 2A) detects a predefined trigger condition as to a respective flash memory device in response to receiving a deferred error from the respective flash memory device. In this example, the respective flash memory device sends a deferred error to storage controller 120 after receiving a memory access request from storage controller 120. In FIG. 6, for example, storage controller 120 or a component thereof (e.g., trigger condition detection module 220, FIG. 2A) detects a predefined trigger condition as to a respective flash memory device upon receiving a notification from the respective flash memory device. In this example, the respective flash memory device sends a proactive error to storage controller 120 after determining that a threshold number of flash memory blocks of the respective flash memory device have failed. In FIG. 7, for example, storage controller 120 or a component thereof (e.g., trigger condition detection module 220, FIG. 2A) detects a predefined trigger condition as to a respective flash memory device after determining that a threshold number of blocks for the respective flash memory device have failed.

In some embodiments, the detected predefined trigger condition is (814) one of a set of a predefined trigger conditions. For example as stated above, the set of predefined trigger conditions includes: storage controller 120 receiving a deferred error from a respective flash memory device; storage controller 120 receiving a proactive error from a respective flash memory device; and storage controller 120 determining that a threshold number of blocks for a respective flash memory device have failed. Where the deferred or proactive errors are received by storage controller 120, each of the plurality of flash memory devices maintains a counter indicating a number of failed flash memory blocks for the respective flash memory device. Where storage controller 120 determines that a threshold number of blocks for a respective flash memory device have failed, storage controller 120 maintains a counter for each of the plurality of flash memory devices indicating a number of failed flash memory blocks for a respective flash memory device of the plurality of flash memory devices.

In some embodiments, the storage controller detects (816) the predefined trigger condition after directing a memory access request to the respective flash memory device. In FIG. 5, for example, storage controller 120 or a component thereof (e.g., trigger condition detection module 220, FIG. 2A) detects a predefined trigger condition as to a respective flash memory device in response to receiving the deferred error and after directing a memory access request to the respective flash memory device at step 506.

In some embodiments, the predefined trigger condition indicates (818) that a counter of failed flash memory blocks for the respective flash memory device exceeds an integer multiple of a threshold number, the threshold number comprising the number of flash memory blocks included in a logical chunk or an integer multiple of the number of flash memory blocks included in a logical chunk. In FIG. 5, for example, storage controller 120 receives a deferred error from a respective flash memory device indicating that that a counter of failed flash memory blocks for the respective flash memory device exceeds an integer multiple of a threshold number. In FIG. 6, for example, storage controller 120 receives a proactive error from a respective flash memory device indicating that that a counter of failed flash memory blocks for the respective flash memory device exceeds an integer multiple of a threshold number. In FIG. 7, for example, storage controller 120 determines that a counter of failed flash memory blocks for a respective flash memory device exceeds an integer multiple of a threshold number. For example, if a logical chunk comprises 10 flash memory blocks, the threshold number is 10 or an integer multiple of 10 (e.g., 20, 30, 40, 50, etc.). For example, when the threshold number is 10, the predefined trigger condition indicates that the counter of failed flash memory blocks for the respective flash memory device exceeds 10 or an integer multiple of 10 (e.g., 20, 30, 40, 50, etc.).

In some embodiments, in response to detecting (820) the predefined trigger condition, the storage controller queries (822) the respective flash memory device to determine whether the size of the respective flash memory device is smaller than a previous size of the respective flash memory device, and the decreasing, updating, and rebalancing are performed in accordance with a determination that the query indicates that the size of the respective flash memory device is smaller than the previous size of the respective flash memory device. In FIG. 5, for example, storage controller 120 or a component thereof (e.g., trigger condition detection module 220, FIG. 2A) detects a predefined trigger condition as to the respective flash memory device upon receiving the deferred error from the respective memory device. In FIG. 5, for example, storage controller 120 or a component thereof queries the respective flash memory device at step 510 in response to detecting the predefined trigger condition as to a respective flash memory device. In FIG. 5, for example, storage controller 120 or a component thereof (e.g., distribution module 222, FIG. 2A) initiates the rebalancing process (including the decreasing, updating, and rebalancing) at step 516 upon determining that the current advertised size of the device is smaller than the previous advertised size of the device at step 514.

In response to detecting (820) the predefined trigger condition, the storage controller decreases (824) the weight corresponding to the respective flash memory device. In some embodiments, storage controller 120 or a component thereof (e.g., algorithm update module 224, FIG. 2A) is configured to decrease the weight associated with a respective flash memory device after detecting a predefined trigger condition as to the respective flash memory device. For example, the weight associated with the respective flash memory device is decreased in the hierarchy map. In FIG. 4A, for example, the weights corresponding to flash memory devices 1, 2, 4, and 6 (e.g., $W_1$, $W_2$, $W_4$, $W_6$) have been decreased in comparison to their weights in FIG. 3A due to the detection of predefined trigger conditions as to flash memory devices 1, 2, 4, and 6. In FIG. 4A, for example, logical chunks 1c, 2a, 2c, 2e, 4b, 4e, and 6d have been crossed out to indicate that they are no longer available and cannot store new data.

In response to detecting (820) the predefined trigger condition, the storage controller updates (826) the distribution algorithm to reflect the decreased weight of the respective flash memory device. In some embodiments, storage controller 120 or a component thereof (e.g., algorithm update module 224, FIG. 2A) is configured to update the distribution algorithm to reflect the decreased weight of the respective flash memory device after detecting a predefined trigger condition as to the respective flash memory device.

In response to detecting (820) the predefined trigger condition, the storage controller rebalances (828) data stored in the plurality of flash memory devices in accordance with the updated distribution algorithm. The decreasing, updating, and rebalancing are sometimes herein referred to as the rebalancing process, which is triggered by detecting the predefined trigger condition as to the respective flash memory device. In some embodiments, rebalancing data stored in the plurality of flash memory devices includes changing the number of logical chunks stored at the plurality of flash memory devices in accordance with the distribution algorithm. For example, storage controller 120 or a component thereof (e.g., balancing module 226, FIG. 2A) is configured to rebalance the number of logical chunks stored at the flash memory devices in accordance with the updated distribution algorithm after detecting a predefined trigger condition as to the respective flash memory device. For example, at least one logical chunk stored on the respective flash memory device (for which the predefined trigger condition was detected) is migrated off of the respective flash memory device to a second flash memory device different from the respective flash memory device. In some embodiments, the second flash memory device different from the respective flash memory device is pseudo-randomly identified according to the updated distribution algorithm. It should be noted that in some embodiments the predefined condition triggering the migration does not have to originate within the respective logical chunk that is selected for migration, just within the same flash memory device. In some embodiments, after the rebalancing is complete, storage controller 120 or a component thereof notifies the respective flash memory device (for which the predefined trigger condition was detected) that at least one logical chunk previously stored by the respective flash memory device has been migrated off of the respective flash memory device and that that at least one logical chunk is now free (e.g., via a TRIM or UNMAP command for a standard SSD).

In some embodiments, the rebalancing includes (830) migrating at least one logical chunk from the respective flash memory device to a second flash memory device different from the respective flash memory device. In some embodiments, the migrating includes: replicating at least one of the plurality of flash memory devices on the respective flash memory device for which the predefined trigger condition was detected; and storing the replicated copy of the at least one of the plurality of flash memory devices at a second flash memory device different from the respective flash memory device. In some embodiments, the migrating includes: selecting one of the plurality of logical chunks of the respective flash memory device for migration in accordance with predefined selection criteria; and storing a replicated logical chunk, comprising a copy of the selected logical chunk, at a second flash memory device different from the respective flash memory device. In some embodiments, predefined selection criteria include a least utilized logical chunk or least populated logical chunk of the respective flash memory device. In some embodiments, predefined selection criteria include the logical chunk associated with a memory access request. In some embodiments, the at least one logical chunk is stored in a different type of memory media than it was previously stored. For example, the at least one logical chunk is migrated from flash memory to HDD or vice versa.

In some embodiments, after migrating the at least one logical chunk from the respective flash memory device to the second flash memory device, storage controller 120 or a component thereof (e.g., logical chunk management module 212, FIG. 2A) is configured to update logical to physical mapping 214 to reflect the migration of the at least one logical chunk. For example, the physical address associated with the logical address (or set of logical addresses) assigned to the at least one logical chunk is changed from a physical address at the respective flash memory device to a physical address at the second flash memory device.

In some embodiments, the second flash memory device is located (832) in a different failure domain than the respective flash memory device. As discussed above, the hierarchy mapping reflects the storage resources of the storage system and each level of the hierarchy mapping is a failure domain (i.e., row, cabinet, shelf, flash memory device). For example, the respective flash memory device (for which the predefined trigger condition was detected) is located in row 1, cabinet 2, shelf 3, device 4 and the second flash memory device is at least in a different failure domain (e.g., a different device). In some embodiments, the set of distribution rules for the distribution algorithm specifies that the second flash memory device (or the location to which the respective logical chunk is migrated to) must cross a predefined number of failure domains. For example, if the set of distribution rules indicates that a respective logical chunk must cross at least two failure domains and the respective logical chunk is stored in row 1, cabinet 2, shelf 3, device 4, the respective logical chunk must at least be migrated to (e.g., replicated and the replicated copy stored in) a different shelf in cabinet 2 (e.g., crossing the device and shelf failure domains).

In some embodiments, in response to detecting (820) the predefined trigger condition, the storage controller re-encodes (834) data in at least one logical chunk of the respective flash memory device with a higher level of error correction protection than a prior encoding of the data in the at least one logical chunk of the respective flash memory device. In some embodiments, storage controller 120 or a component thereof (e.g., re-encoding module 232, FIG. 2A) is configured to re-encode the data in one of the plurality of logical chunks for the respective flash memory device after the predefined trigger condition as to the respective flash memory device is detected. As one example, more parity bits are included (i.e., the parity-to-data ratio is increased) for the respective logical chunk. As another example, a stronger ECC scheme is used for the respective logical chunk. For example, the data stored in the respective logical chunk is re-encoded from Bose-Chaudhuri-Hocquenghem (BCH) encoding to low-density parity check (LDPC) encoding.

In some embodiments, the storage controller arranges (836) the plurality of logical chunks into a plurality of redundancy sets, each redundancy set comprising one or more logical chunks and storing redundant data sufficient to enable recovery of data stored in at least one of the one or more logical chunks. For example, the redundant data includes programs, instructions, ECC, metadata, user data, system data, and/or operator data. In some embodiments, storage controller 120 or a component thereof (e.g., redundancy module 216, FIG. 2A) is configured to arrange the plurality of logical chunks into redundancy sets, where each redundancy set includes one or more logical chunks. In some embodiments, each redundancy set stores redundant data sufficient to enable recovery of data stored in at least one of the one or more logical chunks.

In some embodiments, the storage controller associates (838) one or more logical chunks comprising a respective redundancy set with the respective redundancy set in an indirection table. Indirection table 218 contains the logical addresses of the one or more logical chunks in each redundancy set. In some embodiments, storage controller 120 or a component thereof (e.g., redundancy module 216, FIG. 2A) is configured to maintain and update indirection table 218 as the logical addresses of the one or more logical chunks in redundancy sets change over time (e.g., as a logical chunk is migrated between flash memory devices).

It will be understood that, although the terms "first," "second," etc. may be used herein to describe various elements, these elements should not be limited by these terms. These terms are only used to distinguish one element from another. For example, a first flash memory device could be termed a second flash memory device, and, similarly, a second flash memory device could be termed a first flash memory device, which changing the meaning of the description, so long as all occurrences of the "first flash memory device" are renamed consistently and all occurrences of the "second flash memory device" are renamed consistently. The first flash memory device and the second flash memory device are both flash memory devices, but they are not the same flash memory device.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method of managing a storage system that comprises a storage controller and a plurality of flash memory devices, each with a plurality of flash memory blocks, the method comprising:

at the storage controller:
assigning a weight to each of the plurality of flash memory devices for a distribution algorithm, wherein each of the plurality of flash memory devices has a plurality of logical chunks, each logical chunk including one or more flash memory blocks, and wherein the weight is based on at least a number of available logical chunks for the respective flash memory device, the available logical chunks for the respective flash memory device including logical chunks that already store data and logical chunks able to store new data;
storing data in the plurality of logical chunks of the plurality of flash memory devices in accordance with the distribution algorithm;
detecting a predefined trigger condition with respect to a respective flash memory device of the plurality of flash memory devices; and
in response to detecting the predefined trigger condition:
decreasing the weight corresponding to the respective flash memory device, the decreased weight corresponding to a decreased number of the available logical chunks for the respective flash memory device;
updating the distribution algorithm to reflect the decreased weight of the respective flash memory device; and
rebalancing data stored in the plurality of flash memory devices in accordance with the updated distribution algorithm.

2. The method of claim 1, wherein the rebalancing includes migrating at least one logical chunk from the respective flash memory device to a second flash memory device different from the respective flash memory device.

3. The method of claim 2, wherein the second flash memory device is located in a different failure domain than the respective flash memory device.

4. The method of claim 1, wherein detecting the predefined trigger condition comprises determining that at least a threshold number of blocks of the respective flash memory device have failed, wherein each flash memory block is the minimum size erasable unit of a respective flash memory device in the plurality of flash memory devices.

5. The method of claim 1, wherein the storage controller detects the predefined trigger condition after directing a memory access request to the respective flash memory device.

6. The method of claim 1, further comprising:
in response to detecting the predefined trigger condition, querying the respective flash memory device to determine whether the size of the respective flash memory device is smaller than a previous size of the respective flash memory device; and
wherein the decreasing, updating, and rebalancing are performed in accordance with a determination that the query indicates that the size of the respective flash memory device is smaller than the previous size of the respective flash memory device.

7. The method of claim 1, wherein the predefined trigger condition indicates that a counter of failed flash memory blocks for the respective flash memory device exceeds an integer multiple of a threshold number, the threshold number comprising the number of flash memory blocks included in a logical chunk or an integer multiple of the number of flash memory blocks included in a logical chunk.

8. The method of claim 1, wherein a size of a plurality of logical chunks predetermined by software.

9. The method of claim 1, wherein a size of a plurality of logical chunks is determined based on a protocol used by the storage system.

10. The method of claim 1, further comprising:
in response to detecting the predefined trigger condition with respect to the respective flash memory device, re-encoding data in at least one logical chunk of the respective flash memory device with a higher level of error correction protection than a prior encoding of the data in the at least one logical chunk of the respective flash memory device.

11. The method of claim 1, further comprising:
arranging the plurality of logical chunks into a plurality of redundancy sets, each redundancy set comprising one or more logical chunks and storing redundant data sufficient to enable recovery of data stored in at least one of the one or more logical chunks.

12. The method of claim 11, further comprising:
associating one or more logical chunks comprising a respective redundancy set with the respective redundancy set in an indirection table.

13. A storage controller, comprising:
one or more processors;
a host interface configured to couple the storage controller to a host;
a storage medium interface configured to couple the storage controller to a storage medium including a plurality of flash memory devices, each with a plurality of flash memory blocks;
a storage controller memory storing instructions, which, when executed by the one or more processors, causes the storage controller to perform operations comprising:
assigning a weight to each of the plurality of flash memory devices for a distribution algorithm, wherein each of the plurality of flash memory devices has a plurality of logical chunks, each logical chunk including one or more flash memory blocks, and wherein the weight is based on at least a number of available logical chunks for the respective flash memory device, the available logical chunks for the respective flash memory device including logical chunks that already store data and logical chunks able to store new data;
storing data in the plurality of logical chunks of the plurality of flash memory devices in accordance with the distribution algorithm;
detecting a predefined trigger condition with respect to a respective flash memory device of the plurality of flash memory devices; and
in response to detecting the predefined trigger condition:
decreasing the weight corresponding to the respective flash memory device, the decreased weight corresponding to a decreased number of the available logical chunks for the respective flash memory device;
updating the distribution algorithm to reflect the decreased weight of the respective flash memory device; and
rebalancing data stored in the plurality of flash memory devices in accordance with the updated distribution algorithm.

14. The storage controller of claim 13, wherein the rebalancing includes migrating at least one logical chunk from the respective flash memory device to a second flash memory device different from the respective flash memory device.

15. The storage controller of claim 14, wherein the second flash memory device is located in a different failure domain than the respective flash memory device.

16. The storage controller of claim 13, wherein the instructions cause the storage controller to perform further operations comprising:
in response to detecting the predefined trigger condition with respect to the respective flash memory device, re-encoding data in at least one logical chunk of the respective flash memory device with a higher level of error correction protection than a prior encoding of the data in the at least one logical chunk of the respective flash memory device.

17. The storage controller of claim 13, wherein the instructions cause the storage controller to perform further operations comprising:
arranging the plurality of logical chunks into a plurality of redundancy sets, each redundancy set comprising one or more logical chunks and storing redundant data sufficient to enable recovery of data stored in at least one of the one or more logical chunks.

18. The storage controller of claim 17, wherein the instructions cause the storage controller to perform further operations comprising:
associating one or more logical chunks comprising a respective redundancy set with the respective redundancy set in an indirection table.

19. A non-transitory computer readable storage medium, storing one or more programs for execution by one or more processors of a storage controller coupled to a storage medium including a plurality of flash memory devices, wherein each flash memory device includes a plurality of flash memory blocks, the one or more programs including instructions that when executed by the one or more processors cause the storage controller to:
assign a weight to each of the plurality of flash memory devices for a distribution algorithm, wherein each of the plurality of flash memory devices has a plurality of logical chunks, each logical chunk including one or more flash memory blocks, and wherein the weight is based on at least a number of available logical chunks for the respective flash memory device, the available logical chunks for the respective flash memory device including logical chunks that already store data and logical chunks able to store new data;
store data in the plurality of logical chunks of the plurality of flash memory devices in accordance with the distribution algorithm;
detect a predefined trigger condition with respect to a respective flash memory device of the plurality of flash memory devices; and
in response to detecting the predefined trigger condition:
decrease the weight corresponding to the respective flash memory device, the decreased weight corresponding to a decreased number of the available logical chunks for the respective flash memory device;
update the distribution algorithm to reflect the decreased weight of the respective flash memory device; and rebalance data stored in the plurality of flash memory devices in accordance with the updated distribution algorithm.

20. The non-transitory computer readable storage medium of claim 19, wherein the rebalancing includes migrating at least one logical chunk from the respective flash memory device to a second flash memory device different from the respective flash memory device.

21. The non-transitory computer readable storage medium of claim 20, wherein the second flash memory device is located in a different failure domain than the respective flash memory device.

22. The non-transitory computer readable storage medium of claim 19, wherein the one or more programs further include instructions that when executed by the one or more processors cause the storage controller to:
    in response to detecting the predefined trigger condition with respect to the respective flash memory device, re-encode data in at least one logical chunk of the respective flash memory device with a higher level of error correction protection than a prior encoding of the data in the at least one logical chunk of the respective flash memory device.

23. The non-transitory computer readable storage medium of claim 19, wherein the one or more programs further include instructions that when executed by the one or more processors cause the storage controller to:
    arrange the plurality of logical chunks into a plurality of redundancy sets, each redundancy set comprising one or more logical chunks and storing redundant data sufficient to enable recovery of data stored in at least one of the one or more logical chunks.

24. The non-transitory computer readable storage medium of claim 23, wherein the one or more programs further include instructions that when executed by the one or more processors cause the storage controller to:
    associate one or more logical chunks comprising a respective redundancy set with the respective redundancy set in an indirection table.

* * * * *